(12) United States Patent
Nozawa

(10) Patent No.: US 11,529,806 B2
(45) Date of Patent: Dec. 20, 2022

(54) LIQUID EJECTING APPARATUS AND DRIVE CIRCUIT

(71) Applicant: SEIKO EPSON CORPORATION, Tokyo (JP)

(72) Inventor: Dai Nozawa, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 22 days.

(21) Appl. No.: 17/133,768

(22) Filed: Dec. 24, 2020

(65) Prior Publication Data
US 2021/0197550 A1    Jul. 1, 2021

(30) Foreign Application Priority Data
Dec. 26, 2019   (JP) .............................. JP2019-235895

(51) Int. Cl.
*B41J 2/045*    (2006.01)
(52) U.S. Cl.
CPC ....... *B41J 2/04541* (2013.01); *B41J 2/04581* (2013.01)
(58) Field of Classification Search
CPC .................................................. B41J 2/04581
See application file for complete search history.

(56) References Cited

U.S. PATENT DOCUMENTS

| 5,034,710 A | * | 7/1991 | Kawaguchi | ......... H03H 7/0115 |
| | | | | 336/200 |
| 2015/0062220 A1 | | 3/2015 | Kashimura et al. | |
| 2016/0339690 A1 | * | 11/2016 | Matsumoto | ............ B41J 2/0455 |
| 2018/0183352 A1 | * | 6/2018 | Kitazawa | ............. B41J 2/04593 |
| 2018/0272696 A1 | * | 9/2018 | Ito | ........................ B41J 2/04515 |
| 2019/0105896 A1 | | 4/2019 | Nozawa | |
| 2021/0050837 A1 | | 2/2021 | Shigematsu | |

FOREIGN PATENT DOCUMENTS

| JP | 2005167470 A | * | 6/2005 |
| JP | 2017-071171 A | | 4/2017 |
| WO | 2019/235261 A1 | | 12/2019 |

* cited by examiner

*Primary Examiner* — Shelby L Fidler
(74) *Attorney, Agent, or Firm* — Global IP Counselors, LLP

(57) ABSTRACT

A liquid ejecting apparatus includes a drive circuit that outputs a drive signal, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a first face and a second face opposite to the first face, wherein the demodulation circuit includes a first coil and a second coil electrically coupled in parallel with the first coil, and wherein the first coil is positioned so as to overlap at least part of the second coil in a direction normal to the first face.

3 Claims, 17 Drawing Sheets

| [SIH, SIL] | | [1, 1]<br>LARGE DOT | [1, 0]<br>MEDIUM DOT | [0, 1]<br>SMALL DOT | [0, 0]<br>NO DOTS<br>RECORDED |
|---|---|---|---|---|---|
| S1 | T1 | H | H | H | L |
|    | T2 | H | L | L | L |
| S2 | T1 | L | L | L | H |
|    | T2 | L | H | L | L |

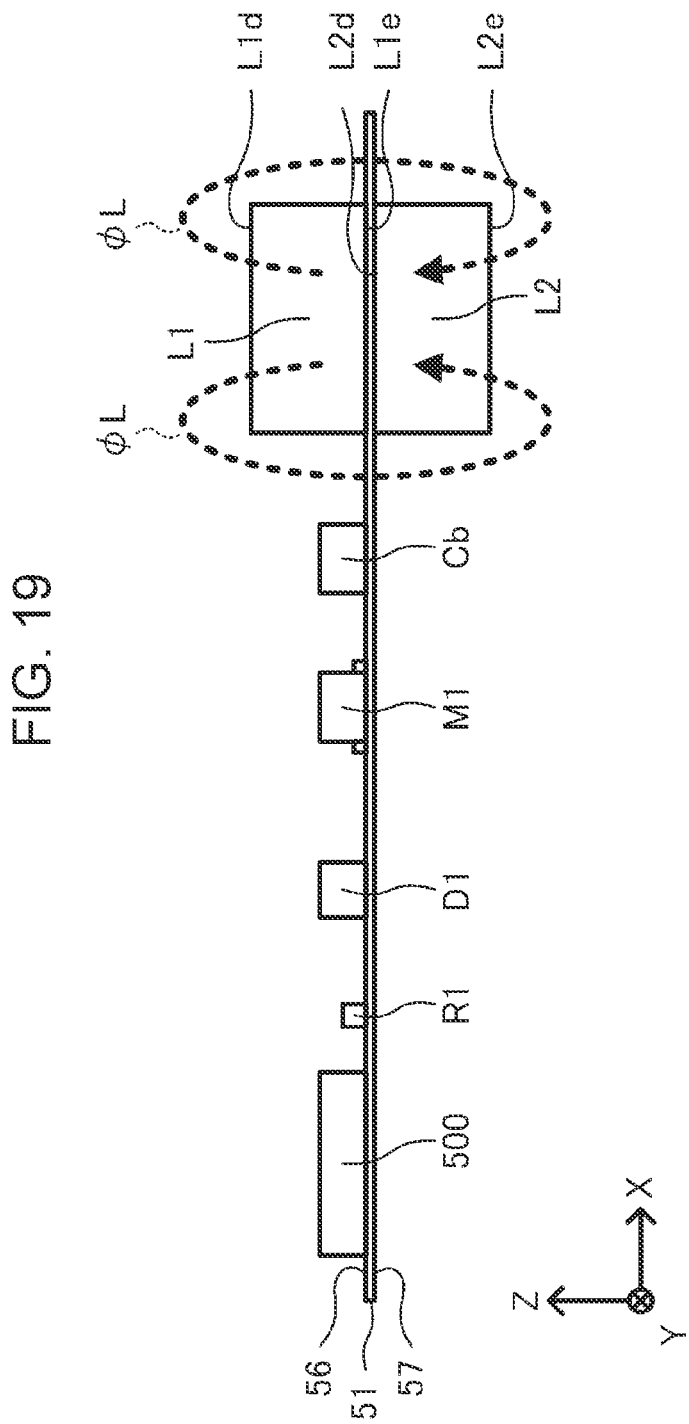

LIQUID EJECTING APPARATUS AND DRIVE CIRCUIT

The present application is based on, and claims priority from JP Application Serial Number 2019-235895, filed Dec. 26, 2019, the disclosure of which is hereby incorporated by reference herein in its entirety.

BACKGROUND

1. Technical Field

The present disclosure relates to a liquid ejecting apparatus and a drive circuit.

2. Related Art

An ink jet printer that prints an image or a document on a medium by ejecting ink as a liquid is known in which a piezoelectric element such as a piezo element is used. The piezoelectric element is provided corresponding to each of the plurality of nozzles in the head unit. A predetermined amount of ink is ejected from the corresponding nozzle at a predetermined timing by driving each of the piezoelectric elements in accordance with the drive signal. As a result, dots are formed on the medium. Such a piezoelectric element is electrically a capacitive load, such as a capacitor, and therefore, it is necessary to supply a sufficient current to operate the piezoelectric element corresponding to each nozzle.

In order to supply a sufficient current for operating the piezoelectric element, as a drive circuit, an amplifier circuit that amplifies the supplied original signal to output the amplified signal as a drive signal is used. Such an amplifier circuit may be a class A amplifier circuit, a class B amplifier circuit, a class AB amplifier circuit, or the like, but from the viewpoint of power consumption reduction in recent years, in some cases, a class D amplifier circuit that is superior in energy conversion efficiency to the class A amplifier circuit, the class B amplifier circuit, and the class AB amplifier circuit is used.

For example, JP-A-2017-071171 discloses a liquid ejecting apparatus including a class D amplifier circuit as a drive circuit that outputs a drive signal for driving a piezoelectric element.

In recent years, the liquid ejecting apparatus has an increasing number of nozzles included in a print head from the viewpoint of improving print quality and printing speed. Therefore, the amount of current based on the drive signal output by the drive circuit included in the liquid ejecting apparatus is increasing. In other words, as the number of drive elements driven by the drive signal increases, the amount of current resulting from the drive signal output from the drive circuit increases. However, in the case of the drive circuit of the class D amplifier system as described in Patent Literature 1, when the amount of current based on the output drive signal increases, the amount of current flowing through an inductor element included in the low-pass filter that functions as a demodulation circuit increases, and as a result, the amount of heat generated by the inductor element increases.

Also, in order to reduce the amount of heat generated by the inductor element, the amount of current that the drive circuit can output is set to the same level as the amount of current that is supplied to the drive element, so that it may be possible to reduce the amount of current flowing through the inductor element, and also reduce the amount of heat of the inductor element. However, when the amount of current that the drive circuit can output is approximately the same as the amount of current that is supplied to the drive element, the feedback current in the drive circuit decreases, and as a result, the operation of the drive circuit may be unstable. When the operation of the drive circuit is unstable, the signal waveform of the drive signal output from the drive circuit is distorted. When such a drive circuit is used in the liquid ejecting apparatus, the ejection accuracy of the liquid ejected from the liquid ejecting apparatus may deteriorate.

As described above, the drive circuit described in Patent Literature 1 has room for improvement in terms of enabling the drive circuit to output a sufficient amount of current and reducing the power consumption of the inductance element included in the demodulation circuit.

SUMMARY

According to an aspect of the present disclosure, a liquid ejecting apparatus includes a liquid ejection head including a drive element, where the liquid ejection head ejects a liquid by a supply of a drive signal to the drive element, and a drive circuit that outputs the drive signal, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a first face and a second face opposite to the first face, wherein the demodulation circuit includes a first coil and a second coil electrically coupled in parallel with the first coil, and wherein the first coil is positioned so as to overlap at least part of the second coil in a direction normal to the first face.

According to another aspect of the present disclosure, in a drive circuit that outputs a drive signal for driving a drive element, the drive circuit include a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a first face and a second face opposite to the first face, wherein the demodulation circuit includes a first coil and a second coil electrically coupled in parallel with the first coil, and wherein the first coil is positioned so as to overlap at least part of the second coil in a direction normal to the first face.

BRIEF DESCRIPTION OF THE DRAWINGS

FIG. 19 is a diagram illustrating an example of the arrangement of the coils L1 and L2 mounted on the substrate of the second embodiment and the direction of a magnetic flux generated by the coils L1 and L2.

DESCRIPTION OF EXEMPLARY EMBODIMENTS

Hereinafter, preferred embodiments of the present disclosure will be described with reference to the drawings. The drawings used are for convenience of explanation. The embodiments described below do not unduly limit the details of the present disclosure described in the claims. In addition, all of the configurations described below are not necessarily essential components of the disclosure.

1. First Embodiment 1.1 Configuration of Liquid Ejecting Apparatus

Figure 1:
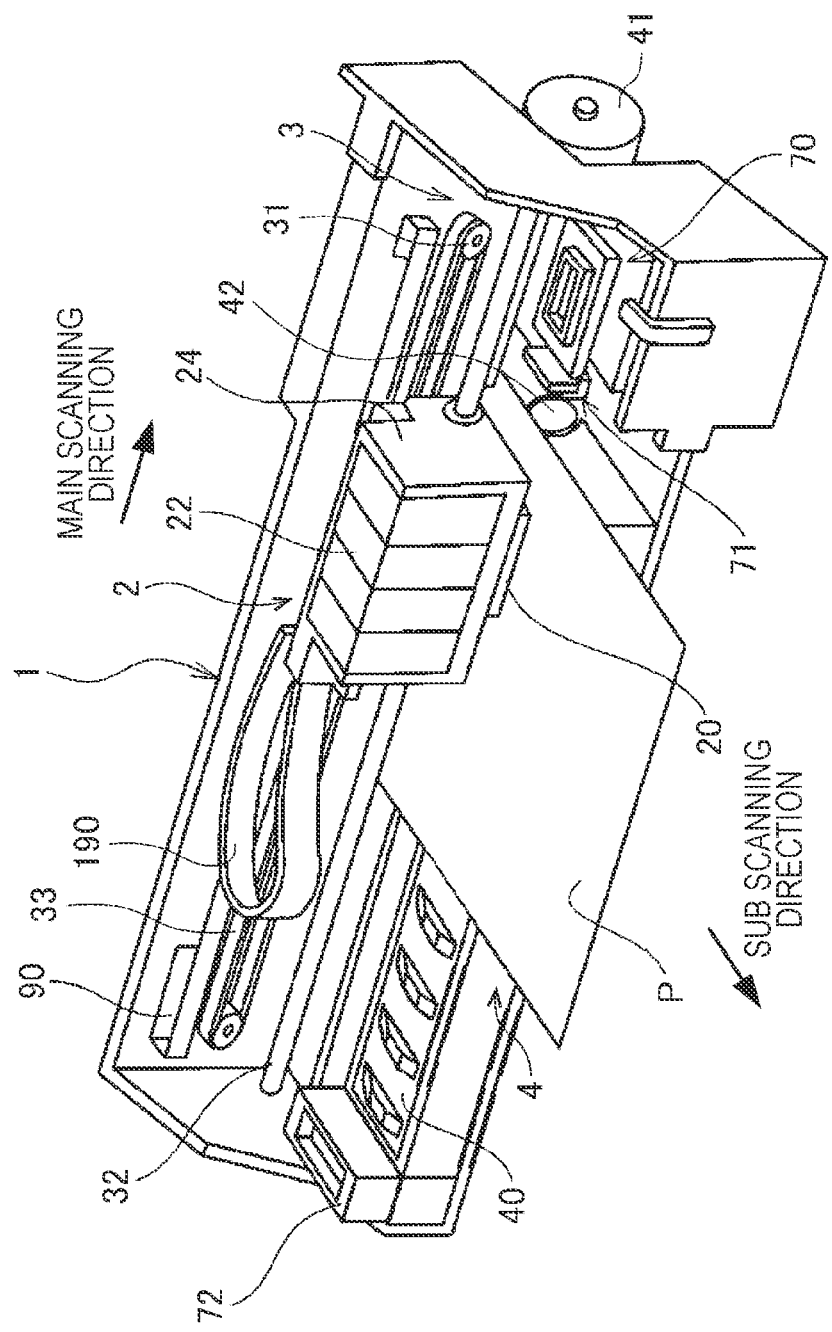
FIG. 1 is a diagram illustrating a schematic configuration of the inside of a liquid ejecting apparatus.

FIG. 1 is a diagram illustrating a schematic configuration of the inside of a liquid ejecting apparatus 1. The liquid ejecting apparatus 1 is an ink jet printer in which the ink, which is an example of a liquid, is ejected in accordance with image data supplied from a host computer provided outside to form dots on a medium P such as paper, thereby printing an image according to the supplied image data. In FIG. 1, some of the components of the liquid ejecting apparatus 1 such as a housing and a cover are not shown.

As shown in FIG. 1, the liquid ejecting apparatus 1 includes a movement mechanism 3 that moves a head unit 2 in the main scanning direction. The movement mechanism 3 includes a carriage motor 31 serving as the driving source of the head unit 2, a carriage guide shaft 32 having both ends fixed, a timing belt 33 extending substantially parallel to the carriage guide shaft 32 and driven by the carriage motor 31. The movement mechanism 3 includes a linear encoder 90 that detects the position of the head unit 2 in the main scanning direction.

A carriage 24 of the head unit 2 is configured so that a predetermined number of ink cartridges 22 can be mounted thereon. The carriage 24 is reciprocably supported by the carriage guide shaft 32 and is fixed to a portion of the timing belt 33. Therefore, the carriage 24 of the head unit 2 is guided by the carriage guide shaft 32 and reciprocates when the carriage motor 31 causes the timing belt 33 to travel forward and backward. That is, the carriage motor 31 moves the carriage 24 in the main scanning direction. A head 20 is attached to a portion, of the carriage 24, facing the medium P. As will be described later, the head 20 includes a large number of nozzles, and ejects a predetermined amount of ink from each nozzle at a predetermined timing. Various control signals are supplied to the head unit 2 operating as described above via a flexible flat cable 190.

The liquid ejecting apparatus 1 includes a transport mechanism 4 that transports the medium P in the sub scanning direction. The transport mechanism 4 includes a platen 40 that supports the medium P, a transport motor 41 that is a driving source, and a transport roller 42 that is rotated by the transport motor 41 and transports the medium P in the sub scanning direction. In a state where the medium P is supported by the platen 40, the ink is ejected from the head 20 onto the medium P according to the timing at which the medium P is transported by the transport mechanism 4. As a result, the ink lands on a desired position on the surface of the medium P, and a desired image is formed on the surface of the medium P.

In addition, a home position serving as a base point of the head unit 2 is set in an end region within the movement range of the carriage 24 included in the head unit 2. A capping member 70 that seals the nozzle formation face of the head 20 and a wiper member 71 that wipes the nozzle formation face are disposed at the home position. The liquid ejecting apparatus 1 forms an image on the surface of the medium P bidirectionally when the carriage 24 moves forward toward the end opposite the home position, and when the carriage 24 moves backward from the opposite end toward the home position.

A flushing box 72 that collects the ink ejected from the head 20 during a flushing operation is provided at the end, of the platen 40 in the main scanning direction, which is opposite the home position from which the carriage 24 moves. The flushing operation is an operation of preventing the possibility that the proper amount of the ink will not be ejected due to the nozzle clogging because of thickening of the ink near the nozzle, the air bubbles mixed in the nozzle, and the like, and an operation forcibly ejecting the ink from each nozzle regardless of the image data in order to. In FIG. 1, the flushing box 72 is provided only on one side of the platen 40 in the main scanning direction, but the flushing boxes 72 may be provided on both sides of the platen 40 in the main scanning direction.

1.2 Electrical Configuration of Liquid Ejecting Apparatus

Figure 2:
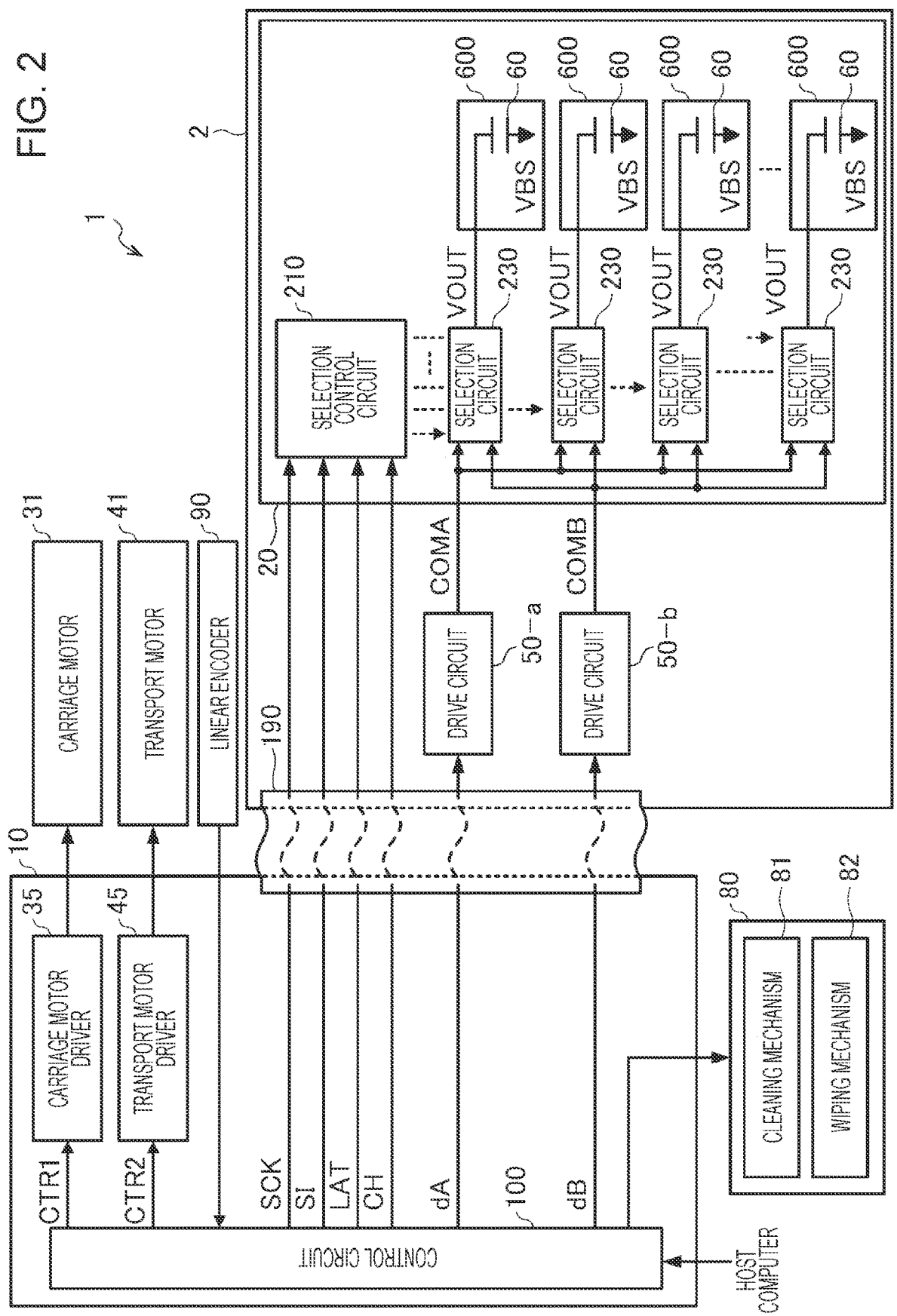
FIG. 2 is a diagram illustrating an electrical configuration of a liquid ejecting apparatus.

FIG. 2 is a diagram illustrating an electrical configuration of the liquid ejecting apparatus 1. As shown in FIG. 2, the liquid ejecting apparatus 1 includes a control unit 10 and the head unit 2. The control unit 10 and the head unit 2 are electrically coupled to each other via the flexible flat cable 190.

The control unit 10 includes a control circuit 100, a carriage motor driver 35, and a transport motor driver 45. The control circuit 100 generates a control signal corresponding to the image data supplied from the host computer to output the generated control signal to a corresponding configuration.

Specifically, the control circuit 100 grasps the current scanning position of the head unit 2 based on the detection signal of the linear encoder 90. The control circuit 100 generates control signals CTR1 and CTR2 corresponding to the current scanning position of the head unit 2. The control signal CTR1 is supplied to the carriage motor driver 35. The carriage motor driver 35 drives the carriage motor 31 according to the input control signal CTR1. Further, the control signal CTR2 is supplied to the transport motor driver 45. The transport motor driver 45 drives the transport motor 41 according to the input control signal CTR2. As a result, the movement of the carriage 24 in the main scanning direction and the transport of the medium P in the sub scanning direction are controlled.

In addition, the control circuit 100 generates, based on image data supplied from an externally provided host computer and a detection signal of the linear encoder 90, a clock signal SCK, a print data signal SI, a latch signal LAT, a change signal CH, and base drive signals dA and dB corresponding to the current scanning position of the head unit 2 to output the generated signals to head unit 2.

Further, the control circuit 100 causes a maintenance unit 80 to perform a maintenance process of restoring the ink ejection state of an ejection unit 600 to a normal state. The maintenance unit 80 includes a cleaning mechanism 81 and a wiping mechanism 82. The cleaning mechanism 81 performs, as a maintenance process, a pumping process for sucking thickened ink, air bubbles, and the like stored in the ejection unit 600 with a tube pump (not shown). Further, the wiping mechanism 82 performs, as a maintenance process, a wiping process of wiping foreign matter such as paper dust attached to the vicinity of the nozzle of the ejection unit 600 with the wiper member 71. The control circuit 100 may perform the above-described flushing operation as a maintenance process of restoring the ink ejection state of the ejection unit 600 to a normal state.

The head unit 2 includes drive circuits 50-a and 50-b, and the head 20.

The drive circuit 50-a receives a digital base drive signal dA. The drive circuit 50-a generates a drive signal COMA by digital-to-analog converting the input base drive signal dA to class-D amplify the converted analog signal to output the generated drive signal COMA to the head 20. Similarly, the drive circuit 50-b receives a digital base drive signal dB. The drive circuit 50-b generates a drive signal COMB by digital-to-analog converting the input base drive signal dB to class-D amplify the converted analog signal to output the generated drive signal COMB to the head 20.

That is, the base drive signal dA defines the waveform of the drive signal COMA, and the base drive signal dB defines the waveform of the drive signal COMB. Therefore, the base drive signals dA and dB may be signals that can define the waveforms of the drive signals COMA and COMB, and may be analog signals, for example. The details of the drive circuits 50-a and 50-b will be described later. Further, in the description of FIG. 2, the drive circuits 50-a and 50-b are included in the head unit 2, but each of the drive circuits 50-a and 50-b may be included in the control unit 10. In this case, the drive signals COMA and COMB output from the drive circuits 50-a and 50-b respectively are supplied to the head 20 of the head unit 2 via the flexible flat cable 190.

The head 20 includes a selection control circuit 210, a plurality of selection circuits 230, and a plurality of ejection units 600 corresponding to the plurality of respective selection circuits 230. The selection control circuit 210 generates, based on the clock signal SCK, the print data signal SI, the latch signal LAT, and the change signal CH supplied from the control circuit 100, a selection signal for selecting or deselecting the waveforms of the drive signals COMA and COMB to output the generated selection signal to each of the plurality of selection circuits 230.

The drive signals COMA and COMB and the selection signal output from the selection control circuit 210 are input to each selection circuit 230. By selecting or deselecting the waveforms of the drive signals COMA and COMB based on the input selection signal, the selection circuit 230 generates a drive signal VOUT based on the drive signals COMA and COMB to output the generated drive signal VOUT to the corresponding ejection unit 600.

Each ejection unit 600 includes a piezoelectric element 60. The drive signal VOUT output from the corresponding selection circuit 230 is supplied to one end of the piezoelectric element 60. Further, a reference voltage signal VBS is applied to the other end of the piezoelectric element 60. The piezoelectric element 60 included in the ejection unit 600 is driven according to a potential difference between the drive signal VOUT supplied to the one end and the reference voltage signal VBS supplied to the other end. An amount of ink corresponding to the driving of the piezoelectric element 60 is ejected from the ejection unit 600.

The reference voltage signal VBS is a signal serving as a reference potential for driving the piezoelectric element 60 based on the drive signal VOUT, and may be output from any of drive circuits 50-a and 50-b, or may be output from a constant voltage output circuit (not shown) different from the drive circuits 50-a and 50-b. In the present embodiment, the reference voltage signal VBS will be described as being output from any of the drive circuits 50-a and 50-b.

Here, the drive circuit 50-a that outputs the drive signal COMA is an example of a drive circuit, and the drive circuit 50-b that outputs the drive signal COMB is another example of a drive circuit. Therefore, the drive signal COMA is an example of a drive signal, and the drive signal COMB is another example of the drive signal. The drive signal VOUT generated by selecting the waveforms of the drive signals COMA and COMB is also an example of the drive signal in a broad sense. The piezoelectric element 60 that is driven by a supply of the drive signal VOUT is an example of a drive element, and the head 20 that includes the piezoelectric element 60, and that ejects the ink by a supply of the drive signal VOUT to the piezoelectric element 60 is an example of a liquid ejection head.

1.3 Configuration of Ejection Unit

Figure 3:
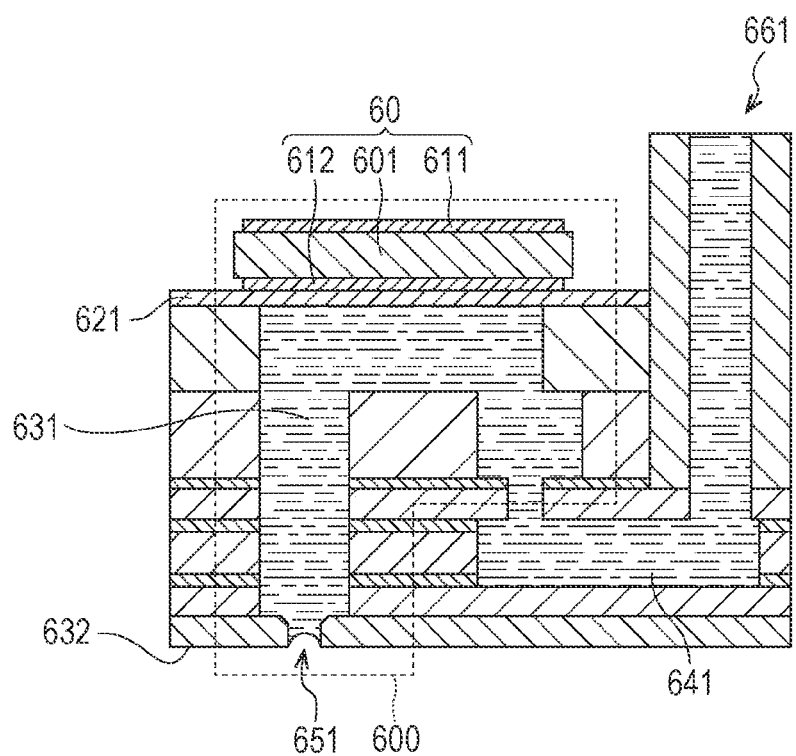
FIG. 3 is a diagram illustrating a schematic configuration of one of ejection units.

FIG. 3 is a diagram illustrating a schematic configuration of one ejection unit 600 of the plurality of ejection units 600 included in the head 20. As shown in FIG. 3, the ejection unit 600 includes the piezoelectric element 60, a vibration plate 621, a cavity 631, and a nozzle 651.

The cavity 631 is filled with the ink supplied from a reservoir 641. Further, the ink is introduced into the reservoir 641 from the ink cartridge 22 via an ink tube (not shown) and a supply port 661. That is, the cavity 631 is filled with the ink stored in the corresponding ink cartridge 22.

The vibration plate 621 is displaced by driving the piezoelectric element 60 provided on the upper face in FIG. 3. With the displacement of the vibration plate 621, the internal volume of the cavity 631 filled with the ink expands or contracts. That is, the vibration plate 621 functions as a diaphragm that changes the internal volume of the cavity 631.

The nozzle 651 is an opening provided in a nozzle plate 632 and communicating with the cavity 631. When the internal volume of the cavity 631 changes, an amount of the ink corresponding to the change in the internal volume is ejected from the nozzle 651.

The piezoelectric element 60 has a structure in which a piezoelectric body 601 is sandwiched between a pair of electrodes 611 and 612. In the piezoelectric body 601 having such a structure, the central portion of the electrodes 611 and 612 bends in the vertical direction together with the vibration plate 621 according to the potential difference between the voltages applied by the electrodes 611 and 612. Specifically, the piezoelectric element 60 bends upward when the voltage level of the drive signal VOUT increases, and bends downward when the voltage level of the drive signal VOUT decreases.

In the ejection unit 600 configured as described above, when the piezoelectric element 60 bends upward, the vibration plate 621 is displaced to increase the internal volume of the cavity 631. As a result, the ink is drawn from the reservoir 641. On the other hand, when the piezoelectric element 60 bends downward, the vibration plate 621 is displaced to reduce the internal volume of the cavity 631. As a result, an amount of the ink corresponding to the degree of reduction is ejected from the nozzle 651.

The piezoelectric element 60 is not limited to the structure shown in FIG. 3, and the ejection unit 600 may have a configuration in which ink can be ejected by driving the piezoelectric element 60. Therefore, the piezoelectric element 60 is not limited to the above-described configuration of the bending vibration, but may be, for example, a configuration using the longitudinal vibration.

1.4 Head Configuration

Next, the configuration and operation of the head 20 will be described. As described above, the head 20 generates the drive signal VOUT by selecting or deselecting the drive signals COMA and COMB output from the drive circuits 50-a and 50-b based on the clock signal SCK, the print data signal SI, the latch signal LAT, and the change signal CH to supply the generated drive signal VOUT to the corresponding ejection unit 600. Therefore, in describing the configuration and operation of the head 20, first, an example of the waveforms of the drive signals COMA and COMB and an example of the waveform of the drive signal VOUT will be described.

Figure 4:
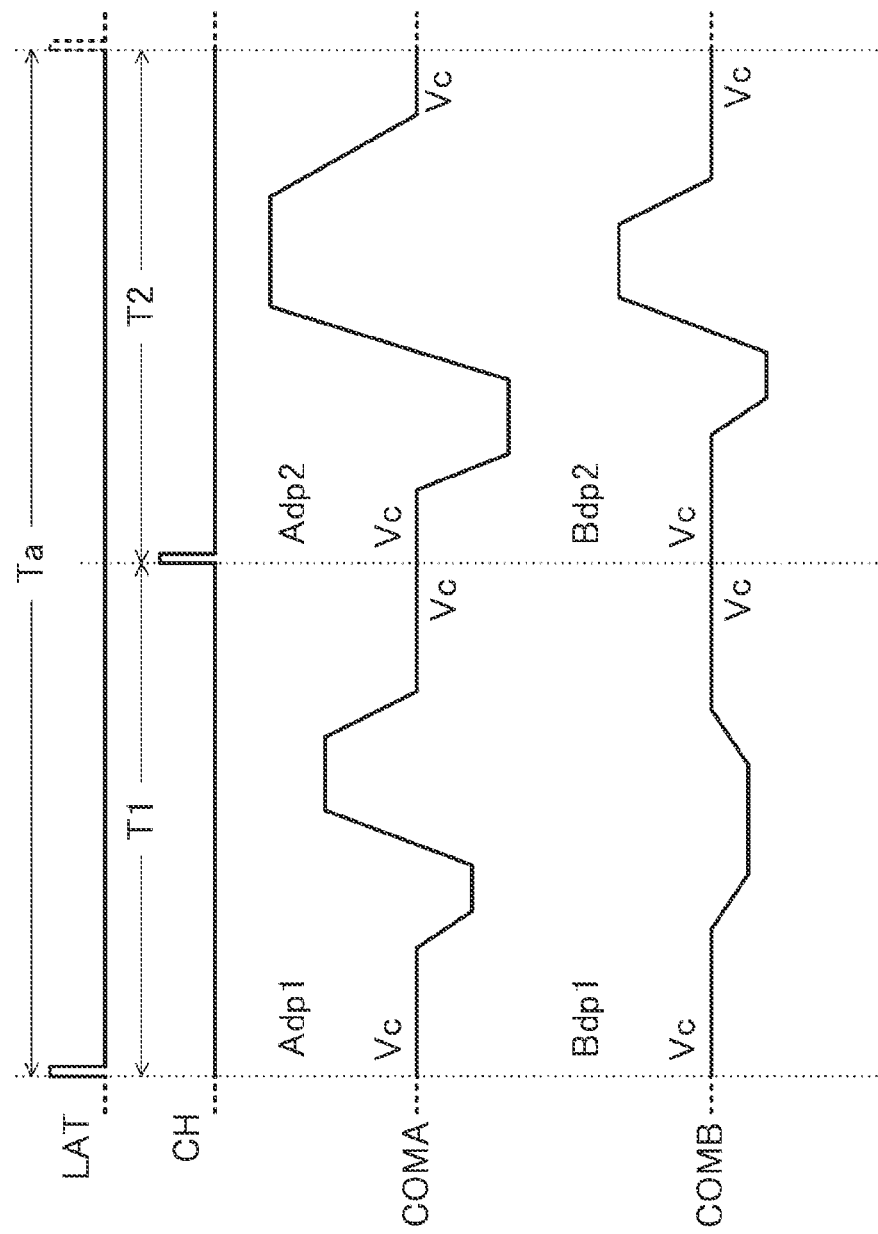
FIG. 4 is a diagram illustrating an example of waveforms of drive signals COMA and COMB.

FIG. 4 is a diagram illustrating an example of the waveforms of the drive signals COMA and COMB. As shown in FIG. 4, the drive signal COMA includes a waveform in which a trapezoidal waveform Adp1 disposed in a period T1 from the rise of the latch signal LAT to the rise of the change signal CH, and a trapezoidal waveform Adp2 disposed in a period T2 from the rise of the change signal CH to the rise of the latch signal LAT are made to be continuous. The trapezoidal waveform Adp1 is a waveform for ejecting a small amount of the ink from the nozzle 651, and the trapezoidal waveform Adp2 is a waveform for ejecting a medium amount of the ink that is larger than the small amount of the ink from the nozzle 651.

Further, the drive signal COMB includes a waveform in which a trapezoidal waveform Bdp1 disposed in the period T1 and a trapezoidal waveform Bdp2 disposed in the period T2 are made to be continuous. The trapezoidal waveform Bdp1 is a waveform that does not eject the ink from the nozzle 651, and that slightly vibrates the ink in the vicinity of the opening of the nozzle 651 to prevent an increase in ink viscosity. Further, as in the trapezoidal waveform Adp1, the trapezoidal waveform Bdp2 is a waveform for ejecting a small amount of the ink from the nozzles 651.

The voltages at the start timing and the end timing of each of the trapezoidal waveforms Adp1, Adp2, Bdp1, and Bdp2 are commonly a voltage Vc. That is, each of the trapezoidal waveforms Adp1, Adp2, Bdp1, Bdp2 has a waveform that starts at the voltage Vc and ends at the voltage Vc. A cycle Ta including the period T1 and the period T2 corresponds to a printing cycle for forming dots on the medium P.

Here, in FIG. 4, the trapezoidal waveform Adp1 and the trapezoidal waveform Bdp2 are identical, but the trapezoidal waveform Adp1 and the trapezoidal waveform Bdp2 may be different. Further, the description is made assuming that a small amount of the ink is ejected from the corresponding nozzle when the trapezoidal waveform Adp1 is supplied to the ejection unit 600, and when the trapezoidal waveform Bdp1 is supplied to the ejection unit 600, but different amounts of the ink may be ejected. That is, the waveforms of the drive signals COMA and COMB are not limited to the waveforms shown in FIG. 4, various waveforms may be combined depending on the moving speed of the carriage 24 to which the head 20 is attached, the nature of the ink stored in the ink cartridge 22, the material of the medium P, and the like.

Figure 5:
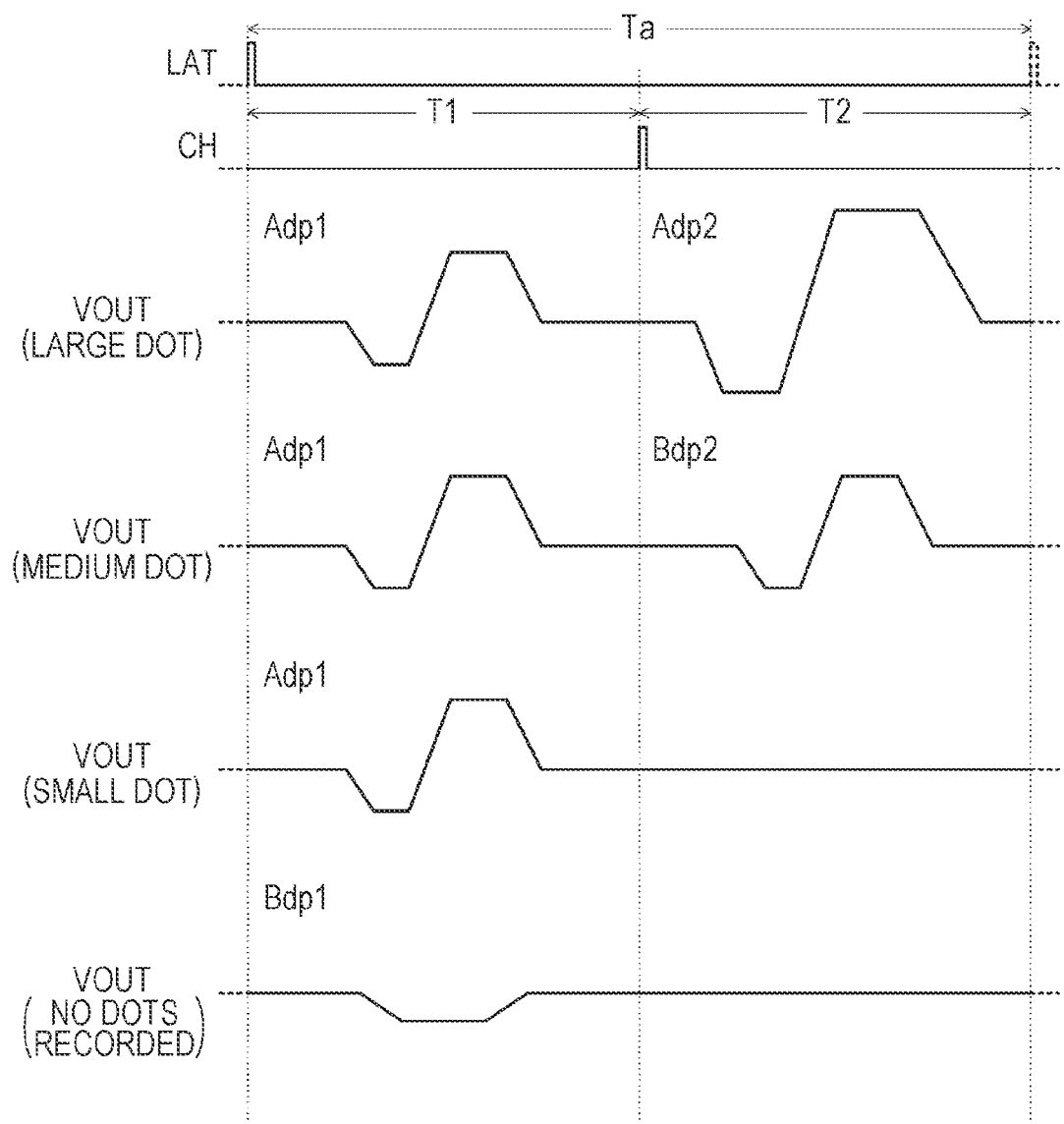
FIG. 5 is a diagram illustrating an example of waveforms of a drive signal VOUT.

FIG. 5 is a diagram illustrating an example of the waveform of the drive signal VOUT. FIG. 5 shows the waveforms of the drive signals VOUT with the dots formed on the medium P having the sizes of a "large dot", a "medium dot", and a "small dot", and "no dots recorded" in comparison.

As shown in FIG. 5, the drive signal VOUT when the "large dot" is formed on the medium P represents a waveform in the cycle Ta in which the trapezoidal waveform Adp1 disposed in the period T1, and the trapezoidal waveform Adp2 disposed in the period T2 are made to be continuous. When the drive signal VOUT is supplied to the ejection unit 600, a small amount of the ink and a medium amount of the ink are ejected from the corresponding nozzle 651 in the cycle Ta. Therefore, the large dot is formed on the medium P by landing and uniting the respective amounts of the ink.

The drive signal VOUT when the "medium dot" is formed on the medium P represents a waveform in the cycle Ta in which the trapezoidal waveform Adp1 disposed in the period T1, and the trapezoidal waveform Bdp2 disposed in the period T2 are made to be continuous. When the drive signal VOUT is supplied to the ejection unit 600, a small amount of the ink is ejected twice from the corresponding nozzle 651 in the cycle Ta. Therefore, the medium dot is formed on the medium P by landing and uniting the respective amounts of the ink.

The drive signal VOUT when the "small dot" is formed on the medium P represents a waveform in the cycle Ta in which the trapezoidal waveform Adp1 disposed in the period T1, and a constant waveform, with the voltage Vc, disposed in the period T2 are made to be continuous. When the drive signal VOUT is supplied to the ejection unit 600, a small amount of the ink is ejected from the corresponding nozzle 651 in the cycle Ta. Therefore, this amount of the ink lands on the medium P to form the small dot.

The drive signal VOUT corresponding to the "no dots recorded" in which no dots are formed on the medium P represents a waveform in the cycle Ta in which the trapezoidal waveform Bdp1 disposed in period T1, and a constant waveform, with the voltage Vc, disposed in the period T2 are made to be continuous. When the drive signal VOUT is supplied to the ejection unit 600, the ink near the opening of the corresponding nozzle 651 only slightly vibrates, and no ink is ejected in the cycle Ta. Therefore, the ink does not land on the medium P and no dots are formed.

Here, the waveform that is constant at the voltage Vc is a waveform with a voltage of the immediately preceding voltage Vc being held in the piezoelectric element 60, which is a capacitive load, when none of the trapezoidal waveforms Adp1, Adp2, Bdp1, and Bdp2 is selected as the drive signal VOUT. Therefore, when none of the trapezoidal waveforms Adp1, Adp2, Bdp1, and Bdp2 is selected as the drive signal VOUT, it can be said that the voltage Vc is supplied to the ejection unit 600 as the drive signal VOUT.

The drive signal VOUT as described above is generated when the waveforms of the drive signals COMA and COMB are selected or deselected by the operation of the selection control circuit 210 and the selection circuit 230.

Figure 6:
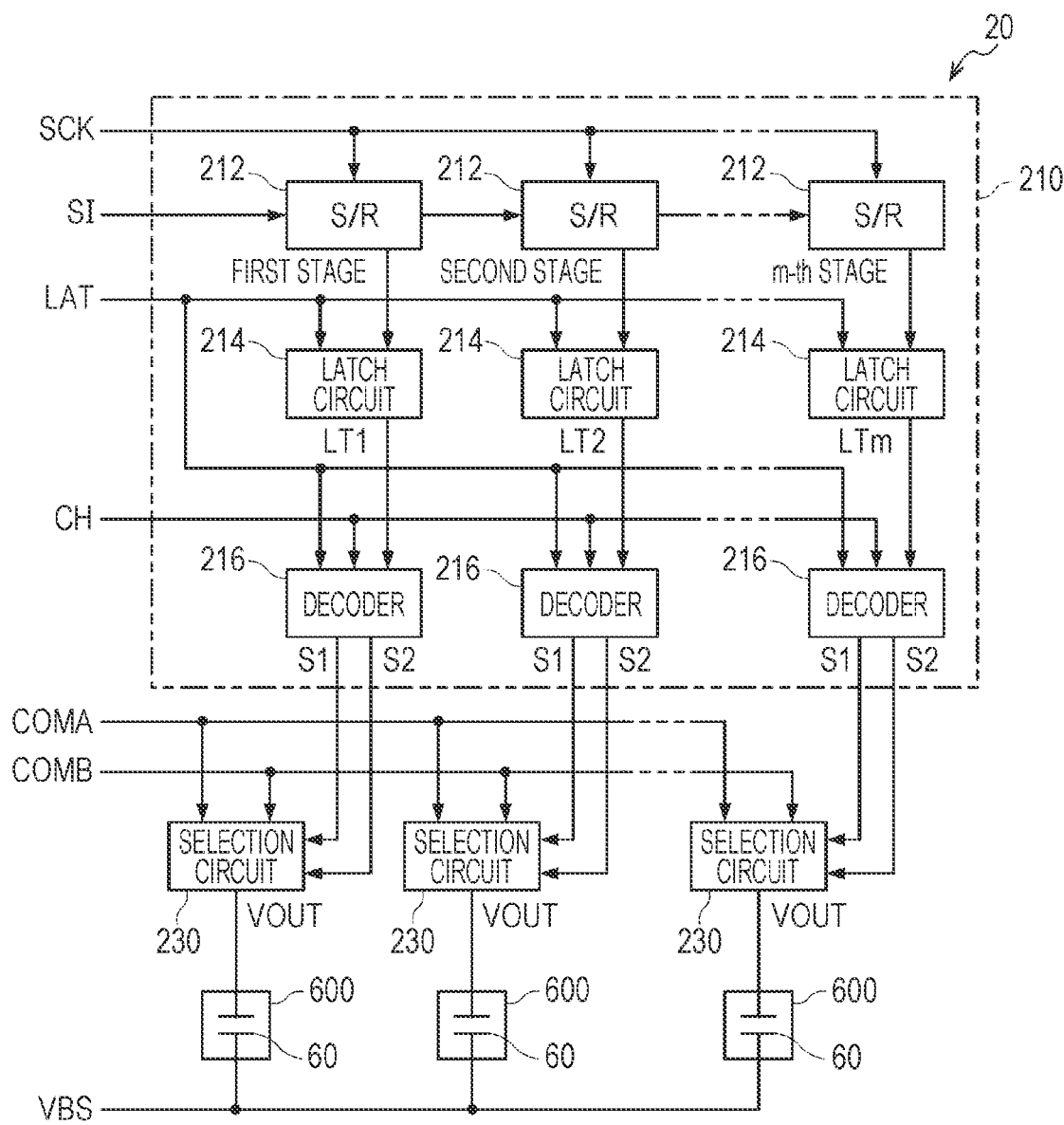
FIG. 6 is a diagram illustrating a configuration of a selection control circuit and a selection circuit.

FIG. 6 is a diagram illustrating configurations of the selection control circuit 210 and the selection circuits 230. As shown in FIG. 6, the print data signal SI, the latch signal LAT, the change signal CH, and the clock signal SCK are input to the selection control circuit 210. The selection control circuit 210 includes a set of a shift register (S/R) 212, a latch circuit 214, and a decoder 216 corresponding to each of the m ejection units 600. That is, the selection control circuit 210 includes the same number of sets of the shift registers 212, the latch circuits 214, and the decoders 216 as the m ejection units 600.

The print data signal SI is a signal synchronized with the clock signal SCK, and is a total 2·m-bit signal including 2-bit print data [SIH, SIL] for selecting any one of the "large dot", the "medium dot", the "small dot", and the "no dots recorded" for each of the m ejection units 600. The input print data signal SI is held in the shift register 212 for 2-bit print data [SIH, SIL] included in the print data signal SI corresponding to each of the m ejection units 600. Specifically, the selection control circuit 210 is configured such that the m-stage shift registers 212 corresponding to the m ejection units 600 are cascade-coupled to each other, and the print data signal SI input serially is sequentially transferred to the subsequent stage according to the clock signal SCK. In FIG. 6, in order to distinguish the shift registers 212, they are denoted as the first stage, the second stage . . . the m-th stage in order from the upstream shift register to which the print data signal SI is input.

The m latch circuits 214 latches the 2-bit print data (SIH, SIL) held by the respective m shift registers 212 at the rising edge of the latch signal LAT.

Figures 7, 8:
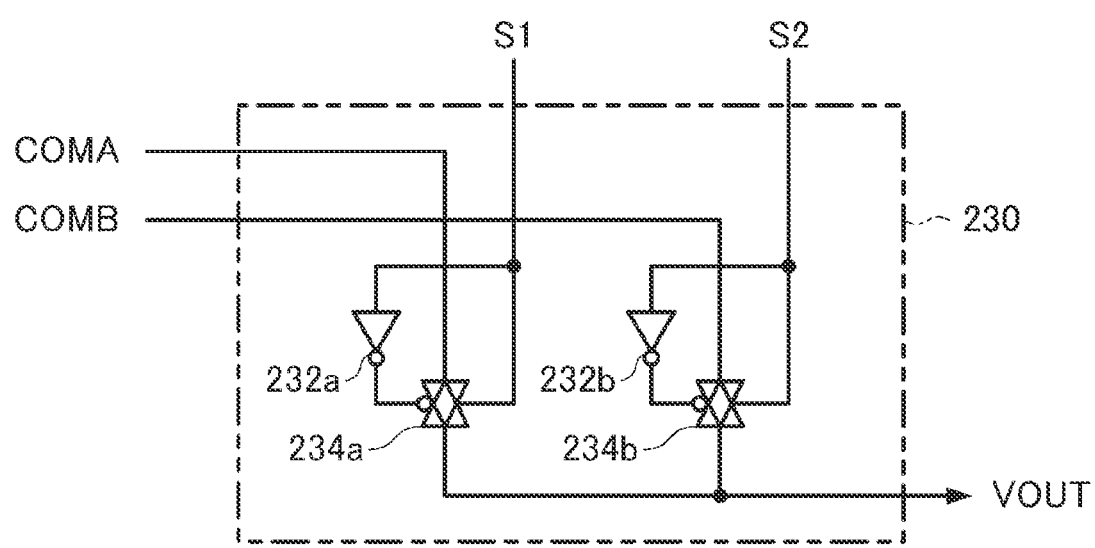
FIG. 7 is a diagram illustrating the decoding contents in a decoder.
FIG. 8 is a diagram illustrating a configuration of a selection circuit.

FIG. 7 is a diagram illustrating the decoding contents in the decoder 216. The decoder 216 outputs selection signals S1 and S2 according to the 2-bit print data (SIH, SIL) latched by the latch circuit 214. For example, when the 2-bit print data (SIH, SIL) is [1, 0], the decoder 216 outputs the logic level of the selection signal S1 as H and L levels in the periods T1 and T2, and the logic level of the selection signal S2 as L and H levels in the periods T1 and T2 to the selection circuit 230.

The selection circuit 230 is provided corresponding to each of the ejection units 600. That is, the number of the selection circuits 230 included in the head 20 is m, which is the same as the total number of the ejection units 600. FIG. 8 is a diagram illustrating a configuration of the selection circuit 230 corresponding to one ejection unit 600. As shown in FIG. 8, the selection circuit 230 includes inverters 232a and 232b, which are NOT circuits, and transfer gates 234a and 234b.

The selection signal S1 is input to the non-circled positive control end in the transfer gate 234a, while being input to the circled negative control end in the transfer gate 234a after logically inverted by the inverter 232a. The drive signal COMA is supplied to the input end of the transfer gate 234a.

The selection signal S2 is input to the non-circled positive control end in the transfer gate 234b, while being input to the circled negative control end in the transfer gate 234b after logically inverted by the inverter 232b. The drive signal COMB is supplied to the input end of the transfer gate 234b. The output ends of the transfer gates 234a and 234b are coupled in common and the drive signal COMA and the drive signal COMB are output as the drive signal VOUT.

Specifically, when the selection signal S1 is at H level, the transfer gate 234a brings the input end and the output end into a conductive state therebetween, and when the selection signal S1 is at L level, the transfer gate 234a brings the input end and the output end into a non-conductive state therebetween. When the selection signal S2 is at H level, the transfer gate 234b brings the input end and the output end into a conductive state therebetween, and when the selection signal S2 is at L level, the transfer gate 234b brings the input end and the output end into a non-conductive state therebetween. As described above, the selection circuit 230 generates and output the drive signal VOUT by selecting the waveforms of the drive signals COMA and COMB based on the selection signals S1 and S2.

Figure 9:
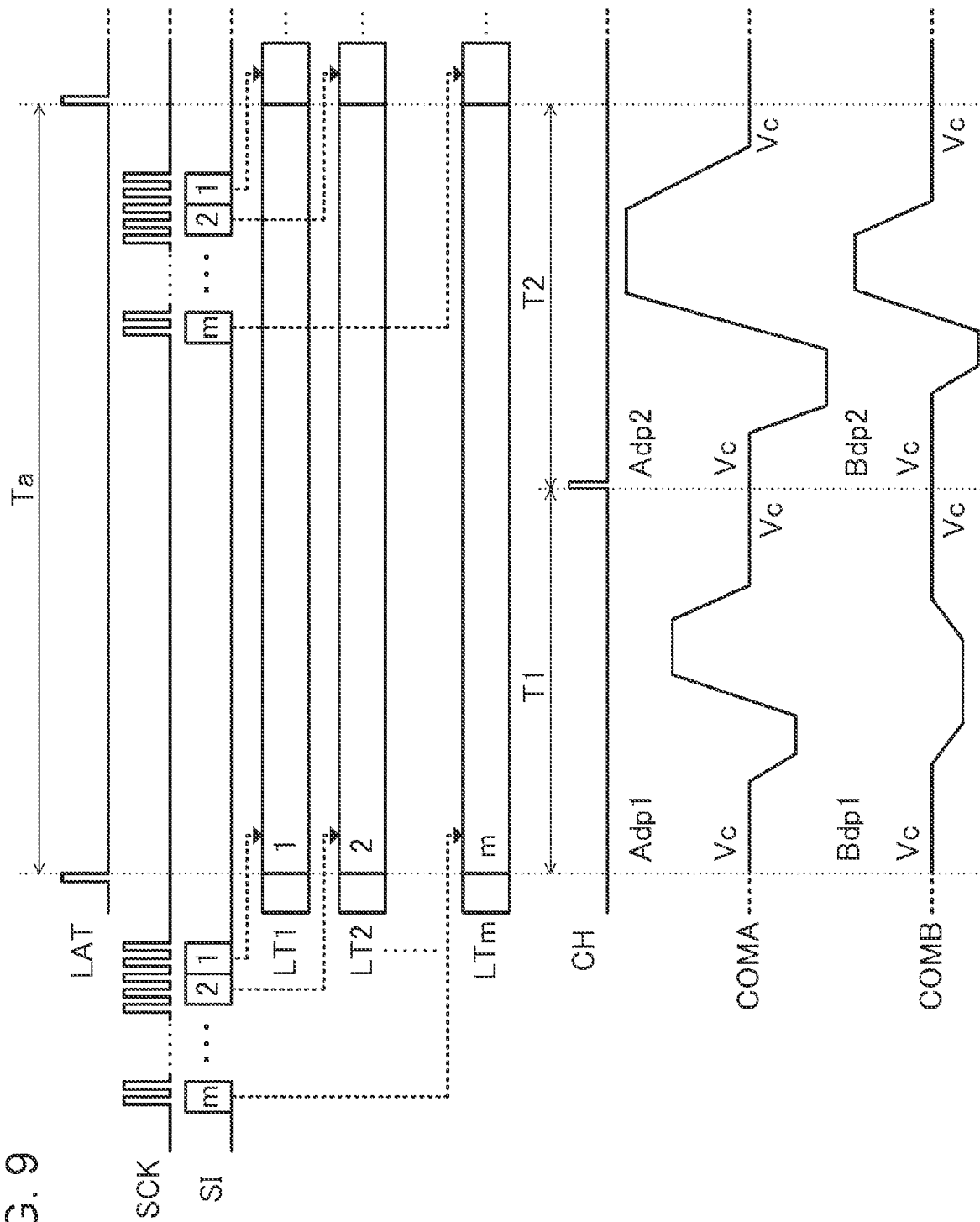
FIG. 9 is a diagram for explaining an operation of the selection control circuit and the selection circuit.

Here, operations of the selection control circuit 210 and the selection circuit 230 will be described with reference to FIG. 9. FIG. 9 is a diagram for explaining the operations of the selection control circuit 210 and the selection circuit 230. The print data signal SI is serially input in synchronization with the clock signal SCK, and is sequentially transferred to the shift registers 212 corresponding to the respective ejection units 600. When the input of the clock signal SCK stops, each shift register 212 holds 2-bit print data [SIH, SIL] corresponding to each of the ejection units 600. The print data signal SI is input to the shift registers 212 of the m-th stage . . . the second stage, the first-stage in the order of the corresponding ejection units 600.

When the latch signal LAT rises, each of the latch circuits 214 simultaneously latches the 2-bit print data [SIH, SIL] held in the respective shift registers 212. In FIG. 9, LT1, LT2 . . . LTm indicate 2-bit print data [SIH, SIL] latched by the latch circuits 214 corresponding to the shift registers 212 of the first stage, the second stage . . . the m-th stage, respectively.

The decoder 216 outputs the logic levels of the selection signals S1 and S2 in accordance with the contents as shown in FIG. 7 in each of the periods T1 and T2 according to a dot size defined by the latched 2-bit print data [SIH, SIL].

Specifically, when the print data [SIH, SIL] is [1, 1], the decoder 216 sets the selection signal S1 to H and H levels in the periods T1 and T2, and sets the selection signal S2 to L and L levels in the periods T1 and T2. In this case, the selection circuit 230 selects the trapezoidal waveform Adp1 in the period T1, and selects the trapezoidal waveform Adp2 in the period T2. As a result, the drive signal VOUT corresponding to the "large dot" shown in FIG. 5 is generated.

Also, when the print data [SIH, SIL] is [1, 0], the decoder 216 sets the selection signal S1 to H and L levels in the periods T1 and T2, and sets the selection signal S2 to L and H levels in the periods T1 and T2. In this case, the selection circuit 230 selects the trapezoidal waveform Adp1 in the period T1, and selects the trapezoidal waveform Bdp2 in the period T2. As a result, the drive signal VOUT corresponding to the "medium dot" shown in FIG. 5 is generated.

Further, when the print data [SIH, SIL] is [0, 1], the decoder 216 sets the selection signal S1 to H and L levels in the periods T1 and T2, and sets the selection signal S2 to L and L levels in the periods T1 and T2. In this case, the selection circuit 230 selects the trapezoidal waveform Adp1 in the period T1, and selects none of the trapezoidal waveforms Adp2 and Bdp2 in the period T2. As a result, the drive signal VOUT corresponding to the "small dot" shown in FIG. 5 is generated.

Further, when the print data [SIH, SIL] is [0, 0], the decoder 216 sets the selection signal S1 to L and L levels in the periods T1 and T2, and sets the selection signal S2 to H and L levels in the periods T1 and T2. In this case, the selection circuit 230 selects the trapezoidal waveform Bdp1 in the period T1, and selects none of the trapezoidal waveforms Adp2 and Bdp2 in the period T2. As a result, the drive signal VOUT corresponding to "no dots recorded" shown in FIG. 5 is generated.

As mentioned above, the selection control circuit 210 and the selection circuit 230 select the waveforms of the drive signals COMA and COMB based on the print data signal SI, the latch signal LAT, the change signal CH, and the clock signal SCK to output the selected waveforms as the drive signal VOUT to the ejection unit 600.

1.5 Drive Circuit Configuration

Next, the configuration and operation of the drive circuits 50-a and 50-b that output the drive signals COMA and COMB will be described. Here, the drive circuit 50-a and the drive circuit 50-b have the same configuration except that the input signal and the output signal are different. Therefore, in the following description, only the configuration and operation of the drive circuit 50-a will be described, and the description of the configuration and operation of the drive circuit 50-b will be omitted.

Figure 10:
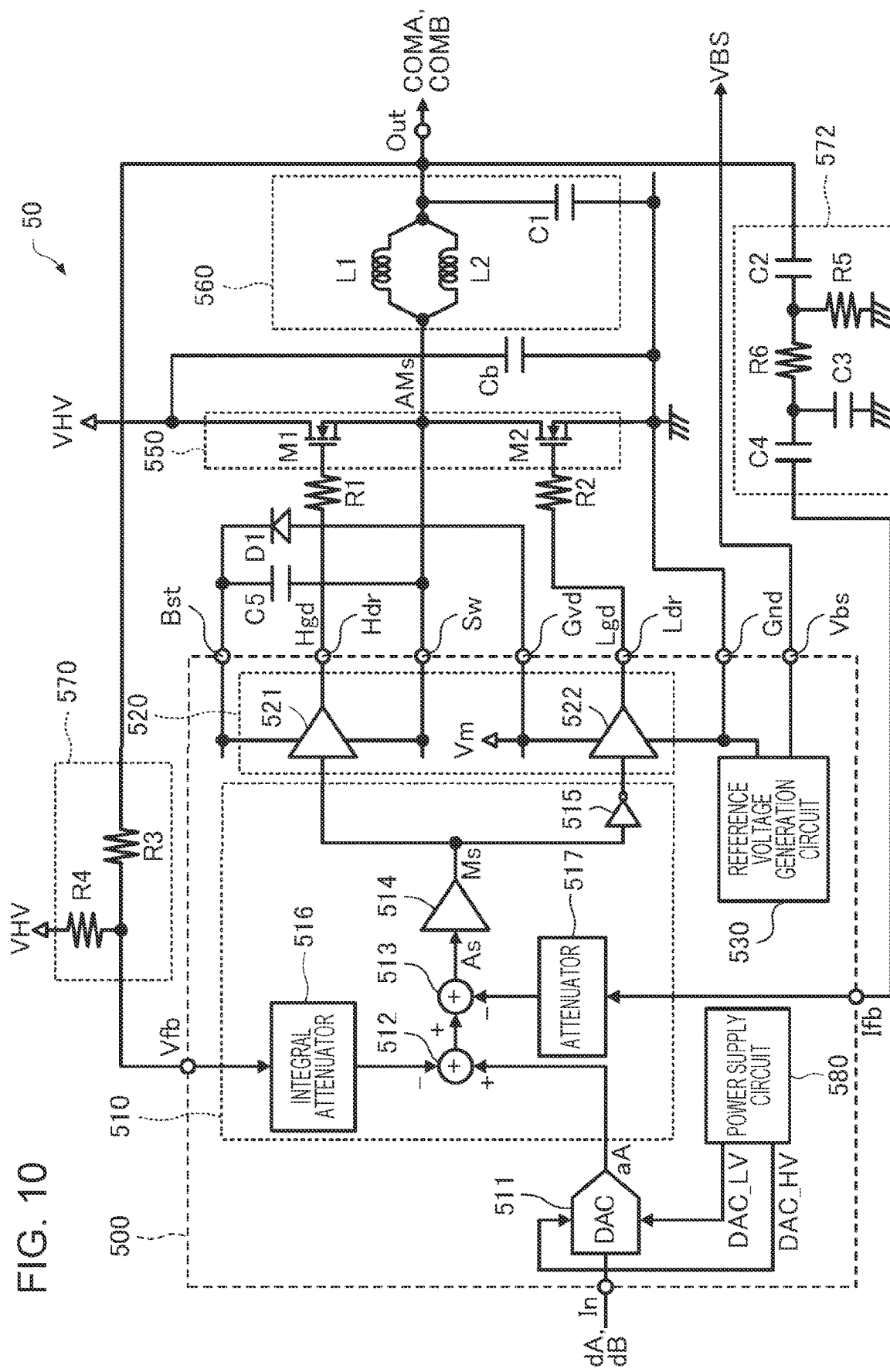
FIG. 10 is a diagram illustrating a circuit configuration of a drive circuit.

FIG. 10 is a diagram illustrating a circuit configuration of the drive circuit 50-a. As shown in FIG. 10, the drive circuit 50-a includes a modulation circuit 510 that modulates the base drive signal dA input from the control circuit 100 to output a modulation signal Ms, an amplifier circuit 550 that amplifies the modulation signal Ms to output an amplified modulation signal AMs, a smoothing circuit 560 that demodulates the amplified modulation signal AMs to output the drive signal COMA for driving the piezoelectric element 60, and a first feedback circuit 570 and a second feedback circuit 572 that are electrically coupled to the modulation circuit 510 and the smoothing circuit 560, and that transfers the drive signal COMA as a feedback signal from the smoothing circuit 560 to the modulation circuit 510. That is, as shown in FIG. 10, the drive circuit 50-a includes an integrated circuit 500 including the modulation circuit 510, the amplifier circuit 550, the smoothing circuit 560, the first feedback circuit 570, the second feedback circuit 572, and a plurality of other circuit elements.

The integrated circuit 500 is electrically coupled to the outside of the integrated circuit 500 through a plurality of terminals including a terminal In, a terminal Bst, a terminal Hdr, a terminal Sw, a terminal Gvd, a terminal Ldr, a terminal Gnd, and a terminal Vbs. The integrated circuit 500 modulates the base drive signal dA input from the terminal In to output an amplification control signal Hgd for driving a transistor M1 included in the amplifier circuit 550 and an amplification control signal Lgd for driving a transistor M2 included in the amplifier circuit 550.

As shown in FIG. 10, the integrated circuit 500 includes a digital to analog converter (DAC) 511, the modulation circuit 510, a gate drive circuit 520, a reference voltage generation circuit 530, and a power supply circuit 580.

The power supply circuit 580 generates a first voltage signal DAC_HV and a second voltage signal DAC_LV to supply them to the DAC 511.

The DAC 511 converts the digital base drive signal dA that defines the waveform of the drive signal COMA into a base drive signal aA that is an analog signal having a voltage value between the first voltage signal DAC_HV and the second voltage signal DAC_LV to output the converted base drive signal aA to the modulation circuit 510. Note that the maximum value of the voltage amplitude of the base drive signal aA is defined by the first voltage signal DAC_HV, and the minimum value is defined by the second voltage signal DAC_LV. That is, the first voltage signal DAC_HV is a reference voltage of the DAC 511 on the high voltage side, and the second voltage signal DAC_LV is a reference voltage of the DAC 511 on the low voltage side. A signal obtained by amplifying the analog base drive signal aA is the drive signal COMA. That is, the base drive signal aA corresponds to a target signal before the amplification of the drive signal COMA. The voltage amplitude of the base drive signal aA in the present embodiment is, for example, 1 V to 2 V.

The modulation circuit 510 generates the modulation signal Ms obtained by modulating the base drive signal aA to output the generated modulation signal Ms to the amplifier circuit 550 via the gate drive circuit 520. Modulation circuit 510 includes adders 512 and 513, a comparator 514, an inverter 515, an integral attenuator 516, and an attenuator 517.

The integral attenuator 516 attenuates and integrates the voltage of a terminal Out input via a terminal Vfb, that is, the drive signal COMA, and supplies the attenuated and integrated signal to a negative input end of the adder 512. The base drive signal aA is input to a positive input end of the adder 512. The adder 512 supplies a voltage obtained by subtracting and integrating the voltage input to the negative input end from the voltage input to the positive input end to the positive input end of the adder 513.

Here, the maximum value of the voltage amplitude of the base drive signal aA is about 2 V as described above, whereas the maximum value of the voltage of the drive signal COMA may exceed 40 V in some cases. For this reason, the integral attenuator 516 attenuates the voltage of the drive signal COMA input via the terminal Vfb in order to match the amplitude ranges of both voltages when obtaining the deviation.

The attenuator 517 supplies a voltage obtained by attenuating the high-frequency component of the drive signal COMA input via a terminal Ifb to the negative input end of the adder 513. Further, the voltage output from the adder 512 is input to the positive input end of the adder 513. The adder 513 outputs to the comparator 514 a voltage signal As obtained by subtracting the voltage input to the negative input end from the voltage input to the positive input end.

The voltage signal As output from the adder 513 is a voltage obtained by subtracting the voltage of the signal supplied to the terminal Vfb and further subtracting the voltage of the signal supplied to the terminal Ifb from the voltage of the base drive signal aA. For this reason, the voltage of the voltage signal As output from the adder 513 is a signal obtained by correcting the deviation obtained by subtracting the attenuation voltage of the drive signal COMA from the voltage of the base drive signal aA as the target signal by the high-frequency component of the drive signal COMA.

The comparator 514 outputs the pulse-modulated modulation signal Ms based on the voltage signal As output from the adder 513. Specifically, the comparator 514 outputs the modulation signal Ms which is at H level when the voltage signal As output from the adder 513 is equal to or higher than a threshold Vth1 described later in a case where the voltage is rising, and is at L level when the voltage signal As falls below a threshold Vth2 described later in a case where the voltage is dropping. Here, the thresholds Vth1 and Vth2 are set in a relationship in which the threshold Vth1 is greater than the threshold Vth2. The frequency and the duty ratio of the modulation signal Ms change in accordance with the base drive signals dA and aA. Therefore, the attenuator 517 adjusts the modulation gain corresponding to the sensitivity, so that the change amount of the frequency or the duty ratio of the modulation signal Ms can be adjusted.

The modulation signal Ms output from the comparator 514 is supplied to a gate driver 521 included in the gate drive circuit 520. The modulation signal Ms is also supplied to a gate driver 522 included in the gate drive circuit 520 after the logic level is inverted by the inverter 515. That is, the logic levels of the signals supplied to the gate driver 521 and the gate driver 522 are mutually exclusive.

Here, the timing may be controlled so that the logic levels of the signals supplied to the gate driver 521 and the gate driver 522 are not H level at the same time. In other words, "exclusive" here means that the logic levels of the signals supplied to the gate driver 521 and the gate driver 522 are not H level at the same time. For details, this means that the transistor M1 and the transistor M2 included in the amplifier circuit 550 are not turned on at the same time.

The gate drive circuit 520 includes the gate driver 521 and the gate driver 522.

The gate driver 521 shifts the level of the modulation signal Ms output from the comparator 514 to output the level-shifted modulation signal Ms as the amplification control signal Hgd from the terminal Hdr. The higher side of the power supply voltage of the gate driver 521 is a voltage applied via the terminal Bst, and the lower side is a voltage applied via the terminal Sw. The terminal Bst is coupled to one end of a capacitor C5 and the cathode of a diode D1 for backflow prevention. The terminal Sw is coupled to the other end of the capacitor C5. The anode of the diode D1 is coupled to the terminal Gvd. As a result, a voltage Vm which is a DC voltage of, for example, 7.5 V supplied from a power supply circuit (not shown) is supplied to the anode of the diode D1. Therefore, the potential difference between the terminal Bst and the terminal Sw is approximately equal to the potential difference between both ends of the capacitor C5, that is, the voltage Vm. The gate driver 521 generates the amplification control signal Hgd having a voltage higher than, by the voltage Vm, that of the terminal Sw according to the input modulation signal Ms to output the generated amplification control signal Hgd from the terminal Hdr.

The gate driver 522 operates at a lower potential than the gate driver 521. The gate driver 522 shifts the level of the signal obtained by inverting, by the inverter 515, the logic level of the modulation signal Ms output from the comparator 514 to output the level-shifted signal as the amplification control signal Lgd from the terminal Ldr. The voltage Vm is applied to the higher side of the power supply voltage of the gate driver 522, and the ground potential of, for example, 0 V is supplied to the lower side via the terminal Gnd. The gate driver 522 generates the amplification control signal Lgd having a voltage higher than, by the voltage Vm, that of the terminal Gnd according to the signal input to the gate driver 522 to output the generated amplification control signal Lgd from the terminal Ldr.

Here, the modulation signal is, in a narrow sense, the modulation signal Ms, but assuming that the signal is pulse-modulated according to the analog base drive signal aA based on the digital base drive signal dA, a signal in which the logic level of the modulation signal Ms is inverted is also included in the modulation signal. That is, the modulation signal output from the modulation circuit 510 includes not only the modulation signal Ms input to the gate driver 521, but also a signal in which the logic level of the modulation signal Ms input to the gate driver 522 is inverted, and a signal whose timing is controlled with respect to the modulation signal Ms. Since the amplification control signal Hgd output from the gate driver 521 is a signal corresponding to the modulation signal Ms input to the gate driver 521, and the amplification control signal Lgd output from the gate driver 522 is a signal corresponding to the signal obtained by inverting the logic level of the modulation signal Ms input to the gate driver 522, the amplification control signals Hgd and Lgd are also signals included in the modulation signal.

The reference voltage generation circuit 530 outputs the reference voltage signal VBS of, for example, a DC voltage of 6 V supplied to a terminal different from the terminal to which the drive signal VOUT of the piezoelectric element 60 is supplied. The reference voltage generation circuit 530 is configured by a constant voltage circuit including a band gap reference circuit, for example. The reference voltage signal VBS is a signal of a potential serving as a reference for driving a piezoelectric element 60, and may be, for example, a signal of a ground potential.

The amplifier circuit 550 includes the transistors M1 and M2. A voltage VHV, which is a DC voltage of, for example, 42 V, is supplied to the drain of the transistor M1. The gate of the transistor M1 is electrically coupled to one end of a resistor R1, and the other end of the resistor 111 is electrically coupled to the terminal Hdr of the integrated circuit 500. That is, the amplification control signal Hgd output from the terminal Hdr of the integrated circuit 500 is supplied to the gate of the transistor M1. The source of the transistor M1 is electrically coupled to the terminal Sw of the integrated circuit 500.

The drain of the transistor M2 is electrically coupled to the terminal Sw of the integrated circuit 500. That is, the drain of the transistor M2 and the source of the transistor M1 are electrically coupled to each other. The gate of the transistor M2 is electrically coupled to one end of a resistor R2, and the other end of the resistor R2 is electrically coupled to the terminal Ldr of the integrated circuit 500. That is, the amplification control signal Lgd output from the terminal Ldr of the integrated circuit 500 is supplied to the gate of the transistor M2. The ground potential is supplied to the source of the transistor M2.

In the amplifier circuit 550 configured as described above, when the transistor M1 is turned off and the transistor M2 is turned on, the voltage of the node to which the terminal Sw is coupled is the ground potential. Therefore, the voltage Vm is supplied to the terminal Bst. On the other hand, when the transistor M1 is turned on and the transistor M2 is turned off, the voltage of the node to which the terminal Sw is coupled is the voltage VHV. Therefore, a voltage signal of the potential of the voltage VHV+Vm is supplied to the terminal Bst.

That is, the gate driver 521 that drives the transistor M1 uses the capacitor C5 as a floating power supply, and when the potential of the terminal Sw changes to 0 V or the voltage VHV according to the operation of the transistor M1 and the transistor M2, the gate driver 521 supplies, to the gate of the transistor M1, the amplification control signal Hgd whose L level is the potential of the voltage VHV and whose H level is the potential of the voltage VHV+the voltage Vm.

On the other hand, the gate driver 522 that drives the transistor M2 supplies, to the gate of the transistor M2, the amplification control signal Lgd whose L level is the ground potential and whose H level is the potential of the voltage Vm irrespective of the operations of the transistor M1 and the transistor M2.

As mentioned above, the amplifier circuit 550 amplifies the modulation signal Ms in which the base drive signals dA and aA are modulated by the transistor M1 and the transistor M2 to generate the amplified modulation signal AMs at a coupling point where the source of the transistor M1 and the drain of the transistor M2 are commonly coupled to output the generated amplified modulation signal AMs to the smoothing circuit 560.

A capacitor Cb functioning as a bypass capacitor is electrically coupled to both ends of the amplifier circuit 550. Specifically, one end of the capacitor Cb is electrically coupled to the drain of the transistor M1, and the other end of the capacitor Cb is electrically coupled to the source of the transistor M2. Thus, the fluctuation of the potential of the voltage VHV caused by the operation of the amplifier circuit 550 is reduced, and as a result, the fluctuation of the maximum voltage value of the amplified modulation signal AMs output from the amplifier circuit 550 is reduced.

The smoothing circuit 560 generates the drive signal COMA by smoothing the amplified modulation signal AMs output from the amplifier circuit 550 to output the generated drive signal COMA from the drive circuit 50-*a*. The smoothing circuit 560 includes coils L1 and L2 and a capacitor C1.

The amplified modulation signal AMs output from the amplifier circuit 550 is input to one end of the coil L1, and the other end of the coil L1 is coupled to the terminal Out that is the output of the drive circuit 50-*a*. Similarly, the amplified modulation signal AMs output from the amplifier circuit 550 is input to one end of the coil L2, and the other end of the coil L2 is coupled to the terminal Out that is the output of the drive circuit 50-*a*. That is, the coil L1 and the coil L2 are electrically coupled in parallel between the amplifier circuit 550 that outputs the amplified modulation signal AMs and the terminal Out. In other words, the smoothing circuit 560 includes the coil L1 and the coil L2 electrically coupled in parallel with the coil L1. The terminal Out, which is the output of the drive circuit 50-*a*, is electrically coupled to each of the selection circuits 230 corresponding to the plurality of respective ejection units 600. As a result, the drive signal COMA output from the drive circuit 50-*a* is supplied to the selection circuit 230.

The other ends of the coils L1 and L2 are also coupled to one end of the capacitor C1. That is, the coil L1 and the coil L2 are electrically coupled in parallel between the amplifier circuit 550 and the capacitor C1. The other end of the capacitor C1 is coupled to the ground potential. That is, the coils L1 and L2 and the capacitor C1 smooth the amplified modulation signal output from the amplifier circuit 550 to demodulate the signal, and output the demodulation signal as the drive signal COMA. Here, the coil L1 is an example of a first coil, the coil L2 is an example of a second coil, and the smoothing circuit 560 including the coils L1 and L2 is an example of a demodulation circuit.

The first feedback circuit 570 includes a resistor R3 and a resistor R4. One end of the resistor R3 is coupled to the terminal Out from which the drive signal COMA is output, and the other end is coupled to the terminal Vfb and one end of the resistor R4. The voltage VHV is supplied to the other end of the resistor R4. As a result, the drive signal COMA that has passed through the first feedback circuit 570 from the terminal Out is fed back to the terminal Vfb in a pulled-up state.

The second feedback circuit 572 includes capacitors C2, C3, and C4 and resistors R5 and R6.

One end of the capacitor C2 is coupled to the terminal Out from which the drive signal COMA is output, and the other end is coupled to one end of the resistor R5 and one end of the resistor R6. The ground potential is supplied to the other end of the resistor R5. Thus, the capacitor C2 and the resistor R5 function as a high pass filter. The cut-off frequency of the high-pass filter is set to, for example, about 9 MHz. The other end of the resistor R6 is coupled to one end of the capacitor C4 and one end of the capacitor C3. The ground potential is supplied to the other end of the capacitor C3. Thus, the resistor R6 and the capacitor C3 function as a low-pass filter. The cut-off frequency of the low-pass filter is set to, for example, about 160 MHz. In this way, since the second feedback circuit 572 includes the high-pass filter and the low-pass filter, so that the second feedback circuit 572 functions as a band pass filter that passes a predetermined frequency range of the drive signal COMA.

The other end of the capacitor C4 is coupled to the terminal Ifb of the integrated circuit 500. As a result, a signal obtained by cutting the DC component out of the high frequency components of the drive signal COMA that has passed through the second feedback circuit 572 that functions as the band pass filter that passes a predetermined frequency component is fed back to the terminal Ifb.

The drive signal COMA output from the terminal Out is a signal obtained by smoothing the amplified modulation signal by the smoothing circuit 560. The drive signal COMA is integrated/subtracted via the terminal Vfb, and then fed back to the adder 512. Therefore, the drive circuit 50-*a* self-oscillates at a frequency determined by the feedback delay and the feedback transfer function.

However, since the feedback path via the terminal Vfb has a large delay amount, so that there is a case where the frequency of the self-oscillation cannot be made high enough to ensure the accuracy of the drive signal COMA simply by the feedback via the terminal Vfb. Therefore, the delay in the entire circuit is reduced by providing a path through which the high-frequency component of the drive signal COMA is fed back via the terminal Ifb separately from the path via the terminal Vfb. As a result, the frequency of the voltage signal As can be made high enough to ensure the accuracy of the drive signal COMA as compared with the case where there is no path via the terminal Ifb.

Figure 11:
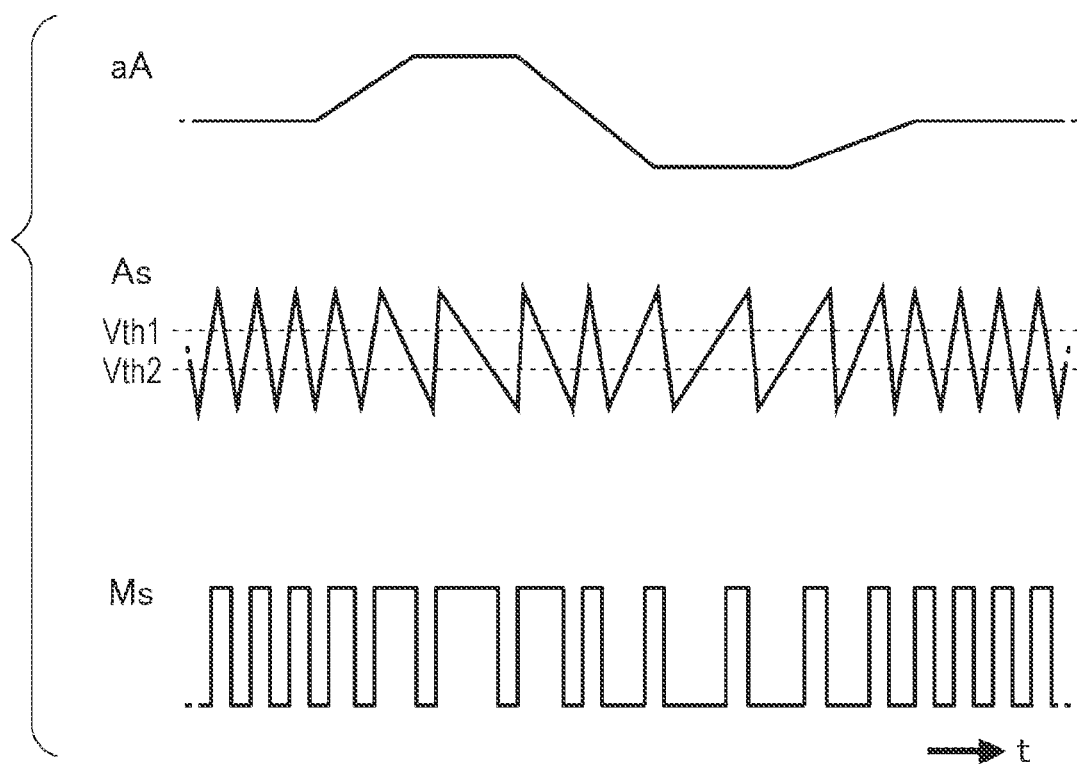
FIG. 11 is a diagram illustrating the waveforms of a voltage signal As and a modulation signal Ms in association with the waveform of an analog base drive signal aA.

FIG. 11 is a diagram illustrating the waveforms of the voltage signal As and the modulation signal Ms in association with the waveform of the analog base drive signal aA.

As shown in FIG. 11, the voltage signal As is a triangular wave, and its oscillation frequency varies according to the voltage of the base drive signal aA. Specifically, the frequency is highest when the voltage has an intermediate value, and decreases as the voltage has a higher value or a lower value than the intermediate value.

Further, the slope of the triangular wave of the voltage signal As at the rise of the voltage is almost equal to that at the fall of the voltage when the voltage has the nearly intermediate value. Therefore, the duty ratio of the modulation signal Ms obtained by comparing the voltage signal As with the thresholds Vth1 and Vth2 of the comparator 514 is approximately 50%. When the voltage of the voltage signal As increases from the intermediate value, the downward slope of the voltage signal As is gentle. Therefore, the period during which the modulation signal Ms is at H level is relatively long, and the duty ratio of the modulation signal Ms increases. On the other hand, when the voltage of the voltage signal As decreases from the intermediate value, the upward slope of the voltage signal As decreases. Therefore, the period during which the modulation signal Ms is at H level is relatively short, and the duty ratio of the modulation signal Ms decreases.

The gate driver 521 turns on or off the transistor M1 based on the modulation signal Ms. That is, the gate driver 521 turns on the transistor M1 when the modulation signal Ms is at H level, and turns off the transistor M1 when the modulation signal Ms is at L level. The gate driver 522 turns on or off the transistor M2 based on the logically inverted signal of the modulation signal Ms. That is, the gate driver 522 turns off the transistor M2 when the modulation signal Ms is at H level and turns on the transistor M2 when the modulation signal Ms is at L level.

Therefore, the voltage value of the drive signal COMA obtained by smoothing the amplified modulation signal output from the amplifier circuit 550 by the smoothing circuit 560 increases as the duty ratio of the modulation signal Ms increases, and decreases as the duty ratio decreases. That is, the control is performed so that the waveform of the drive signal COMA matches the waveform obtained by enlarging the voltage of the base drive signal aA obtained by performing the analog conversion on the digital base drive signal dA.

In addition, since the drive circuit 50-a advantageously uses a pulse density modulation which can have a larger change width of the duty ratio than a pulse width modulation in which the modulation frequency is fixed. The minimum positive pulse width and minimum negative pulse width that can be used in the drive circuit 50-a are limited by circuit characteristics. Therefore, in the pulse width modulation in which the frequency is fixed, the change width of the duty ratio is limited within a predetermined range. In contrast, with the pulse density modulation, as the voltage of the voltage signal As moves away from the intermediate value, the oscillation frequency decreases, and as a result, it is possible to further increase the duty ratio in a region where the voltage is high. Further, it is possible to further decrease the duty ratio in a region where the voltage is low. Therefore, it is possible to secure a wider range of the change width of the duty ratio by employing self-oscillation type pulse density modulation.

1.6 Mounting Layout of Drive Circuit on Substrate

Figure 12:
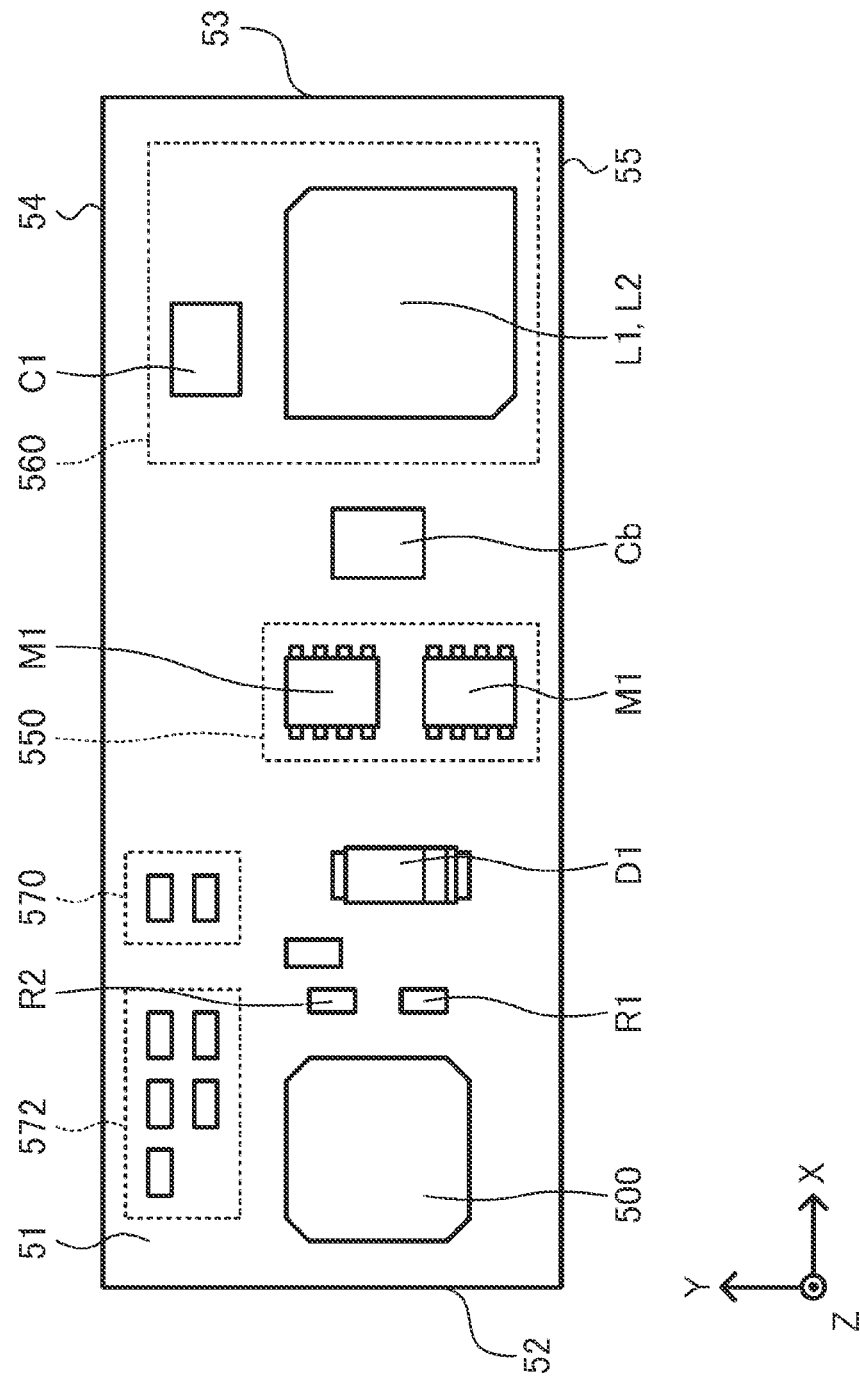
FIG. 12 is a diagram illustrating circuits included in the drive circuit on a substrate.
Figure 13:
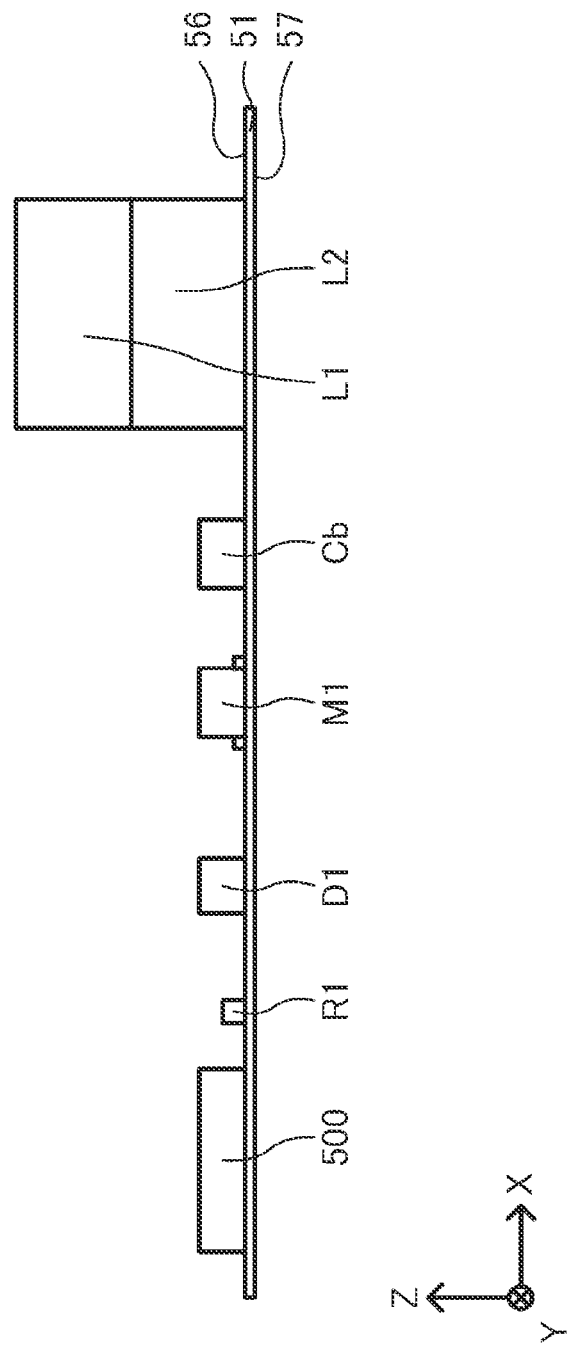
FIG. 13 is a side view of the substrate shown in FIG. 12 when viewed along the Y direction.

Next, the arrangement of the circuits included in the drive circuit 50-a will be described. As shown in FIGS. 12 and 13, the drive circuit 50-a is mounted on a substrate 51. That is, the modulation circuit 510, the amplifier circuit 550, and the smoothing circuit 560 included in the drive circuit 50-a are provided on the substrate 51.

FIG. 12 is a diagram illustrating an arrangement of circuits included in the drive circuit 50-a on the substrate 51. FIG. 13 is a side view of the substrate 51 shown in FIG. 12 when viewed along the Y direction. In the following description, as shown in figures, the description will be made using the X direction, the Y direction, and the Z direction that are orthogonal to each other.

The substrate 51 in the present embodiment has a substantially rectangular shape having a set of sides 52 and 53 extending along the X direction, and located facing each other, and a set of sides 54 and 55 extending along the Y direction, and located facing each other, and includes a face 56 and a face 57 opposite to the face 56. Although FIGS. 12 and 13 show the case where only the drive circuit 50-a is mounted on the substrate 51, a plurality of circuits including the drive circuit 50-b may be mounted on the substrate 51. Here, the face 56 included in the substrate 51 is an example of a first face, and the face 57 is an example of a second face.

As shown in FIG. 12, for the substrate 51, the integrated circuit 500 including the modulation circuit 510, the amplifier circuit 550, and the smoothing circuit 560 are provided on the face 56 of the substrate 51. Specifically, the integrated circuit 500, the amplifier circuit 550, and the smoothing circuit 560 are provided in this order toward the side 53 from the side 52 in the direction along the X direction. Note that any of the integrated circuit 500 including the modulation circuit 510, the amplifier circuit 550, and the smoothing circuit 560 may be provided on the face 57 of the substrate 51.

The transistor M1 and the transistor M2 included in the amplifier circuit 550 are provided in the order of the transistor M1 and the transistor M2 toward the side 54 from the side 55 in the direction along the Y direction. Further, as shown in FIG. 13, the coils L1 and L2 included in the smoothing circuit 560 are provided so as to overlap each other in the direction normal to the face 56 of the substrate 51, that is, the direction along the Z direction. In other words, the coil L1 and the coil L2 are provided on the face 56 of the substrate 51, and the coil L1 is positioned to overlap at least part of the coil L2 in the direction normal to the face 56 of the substrate 51. The capacitor C1 included in the smoothing circuit 560 is positioned toward the side 54 relative to the coils L1 and L2 in the direction along the Y direction.

Further, as shown in FIG. 12, the second feedback circuit 572 is positioned toward the side 54 relative to the integrated circuit 500, and the first feedback circuit 570 is positioned toward the side 55 relative to the second feedback circuit 572. Then, as shown in FIG. 10, the drive signal COMA is fed back to the first feedback circuit 570 and the second feedback circuit 572 via a wiring pattern (not shown). The drive signal COMA input to the first feedback circuit 570 is input to the terminal Vfb of the integrated circuit 500 as a feedback signal, and the drive signal COMA input to the second feedback circuit 572 is input to the terminal Ifb of the integrated circuit 500 as a feedback signal.

As mentioned above, in the drive circuit 50 included in the liquid ejecting apparatus 1 according to the present embodiment, the coils L1 and L2 included in the smoothing circuit 560 are provided so as to overlap each other in the direction normal to the face 56 of the substrate 51, that is, the direction along the Z direction. In this case, the coils L1 and L2 are provided so as to partially overlap each other in the direction normal to the face 56 so that the magnetic flux generated in the coil L1 and the magnetic flux generated in the coil L2 are superimposed.

Next, a specific example in which the coils L1 and L2 are provided so as to partially overlap each other in the direction normal to the face 56 so that the magnetic flux generated in the coil L1 and the magnetic flux generated in the coil L2 are superimposed will be described. In making the description, the magnetic flux generated in the coils L1 and L2 will be described first, and then the description in which the magnetic flux generated in the coil L1 and the magnetic flux generated in the coil L2 are superimposed will be made.

Figure 14:
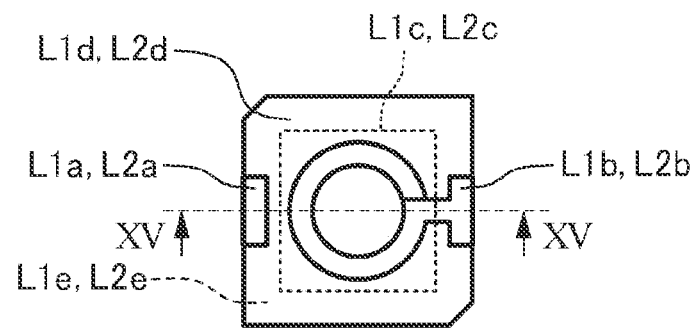
FIG. 14 is a diagram illustrating an example of a configuration of coils L1 and L2.
Figure 15:
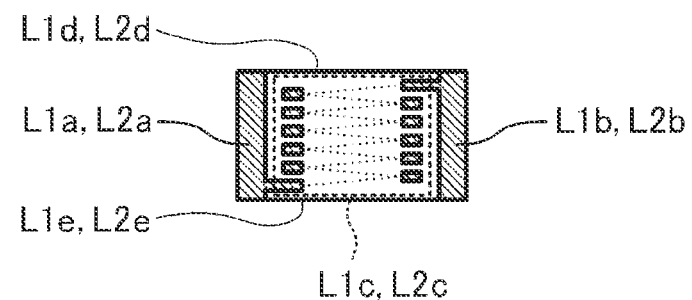
FIG. 15 is a sectional view taken along line XV-XV in FIG. 14.

FIG. 14 is a diagram illustrating an example of the configuration of the coils L1 and L2. FIG. 15 is a sectional view taken along line XV-XV in FIG. 14. The coils L1 and L2 in the embodiment will be described as having the same configuration. Therefore, in the description of FIGS. 14 and 15, the detailed configuration of the coil L1 will be described, and the detailed configuration of the coil L2 may be simplified or omitted.

As shown in FIGS. 14 and 15, the coil L1 includes electrodes L1a and L1b and an annular wire L1c. In the following description, one face of the opposing faces of the coil L1 is referred to as a face L1d, and the other face of the opposing faces of the coil L1 is referred to as a face L1e.

The electrode L1a included in the coil L1 is provided on a face that intersects both the faces L1d and L1d. The amplified modulation signal AMs is input to the electrode L1a. The electrode L1b included in the coil L1 is provided on a face that intersects both the faces L1d and L1d and that faces a face of the electrode L1a. The electrode L1b is electrically coupled to the capacitor C1 and the terminal Out which is an output of the drive circuit 50-a. The annular wire L1c is electrically coupled to the electrode L1a toward the face L1e of the coil L1 and is electrically coupled to the electrode L1a toward the face L1d of the coil L1. The annular wire L1c is a wire formed in a counterclockwise annular shape when viewed from the direction normal to the face L1d.

An electrode L2a included in the coil L2 is provided on a face that intersects both faces L2d and L2d. The amplified modulation signal AMs is input to the electrode L2a. An electrode L2b included in the coil L2 is provided on a face that intersects both the faces L2d and L2d and that faces a face of the electrode L2a. The electrode L2b is electrically coupled to the capacitor C1 and the terminal Out which is an output of the drive circuit 50-a. An annular wire L2c is electrically coupled to the electrode L2a toward a face L2e of the coil L2, and is electrically coupled to the electrode L2a toward a face L2d of the coil L2. The annular wire L2c is a wire formed in a counterclockwise annular shape when viewed from the direction normal to the face L2d.

That is, the coil L1 includes the electrode L1a to which the amplified modulation signal AMs is input, the electrode L1b electrically coupled to the capacitor C1, and the annular wire L1c which electrically connects the electrode L1a and the electrode L1b and is provided in an annular shape, and the coil L2 includes the electrode L2a to which the amplified modulation signal AMs is input, the electrode L2b electrically coupled to the capacitor C1, and the annular wire L2c which electrically connects the electrode L2a and the electrode L2b and is provided in an annular shape.

Here, a magnetic material is provided around the annular wire L1c in the coil L1 and around the annular wire L2c in the coil L2. Since the coils L1 and L2 have a magnetic material, it is possible to increase the magnetic flux generated in the coils L1 and L2. The magnetic material contained in the coils L1 and L2 may be a ferrite material. Since the number of the piezoelectric elements 60 that operate by the drive signal COMA is large, and further, the first feedback circuit 570 and the second feedback circuit 572 are provided to stabilize the operation of the drive circuit 50-a, the magnetic material of the coils L1 and L2 is preferably a metal magnetic material that allows a stable operation with respect to a large current. Further, the coils L1 and L2 may be made of a metal composite type inductor element in which the metal magnetic material and the annular wires L1c and L2c are integrally molded. The coils L1 and L2 made of the metal composite type inductor element makes it possible to improve the time saturation characteristics, the thermal stability, the heat resistance, and the vibration resistance, and to reduce the AC resistance and the vibration beat, compared with those made of the inductor element containing the ferrite material as the magnetic material.

The current caused by the amplified modulation signal AMs supplied to the electrode L1a of the coil L1 configured as described above flows through the annular wire L1c and is output from the electrode L1a. Then, the magnetic flux is generated in the coil L1 according to the direction in which the current flows through the annular wire L1c. Similarly, the current caused by the amplified modulation signal AMs supplied to the electrode L2a of the coil L2 flows through the annular wire L2c and is output from the electrode L2a. Then, the magnetic flux is generated in the coil L2 according to the direction in which the current flows through the annular wire L2c.

Figure 16:
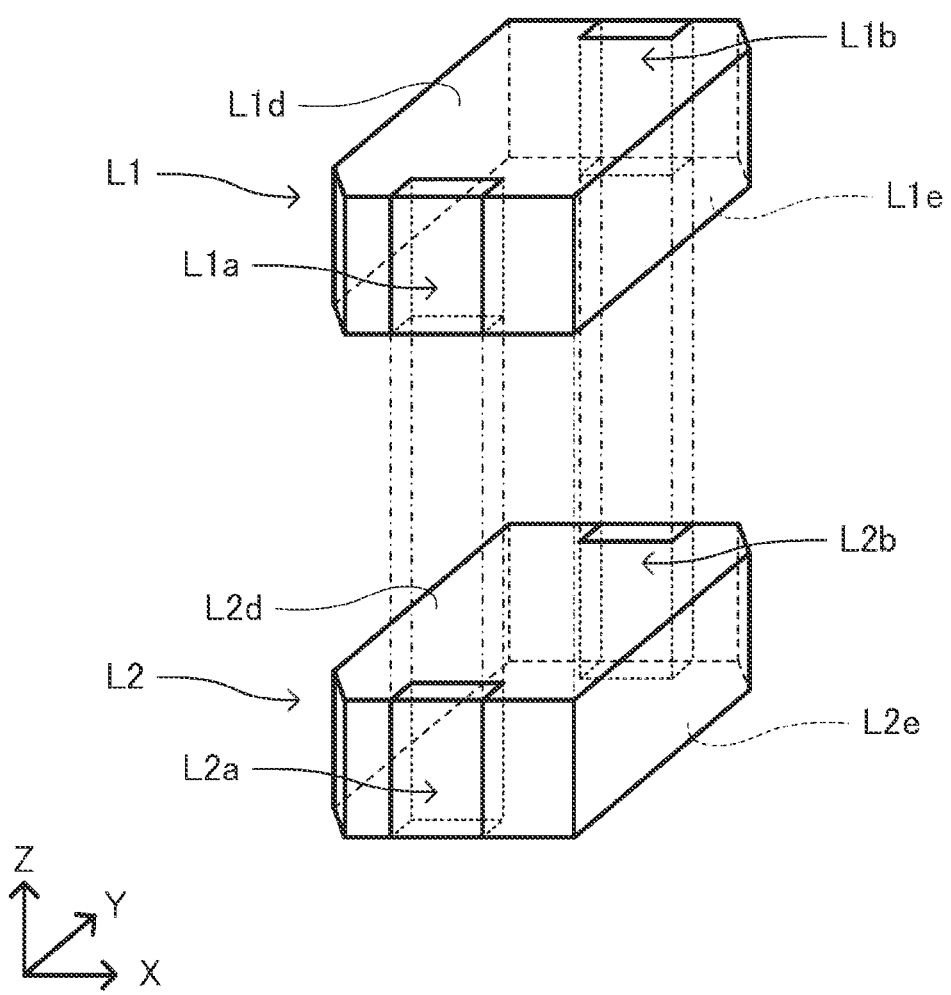
FIG. 16 is a diagram illustrating an example of how the coils L1 and L2 are overlapped in the Z direction of a face 56 of the substrate.
Figure 17:
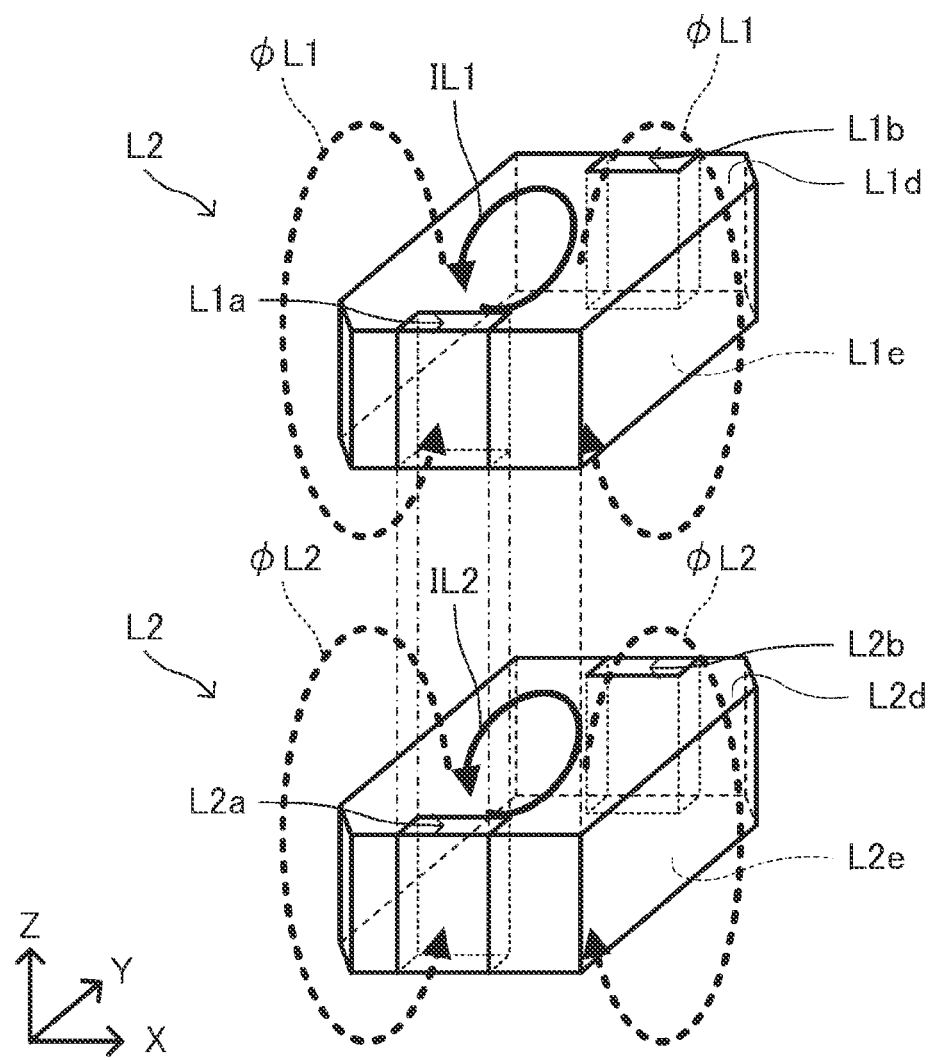
FIG. 17 is a diagram illustrating an example of the direction of a magnetic flux generated in each of the coils L1 and L2.
Figure 18:
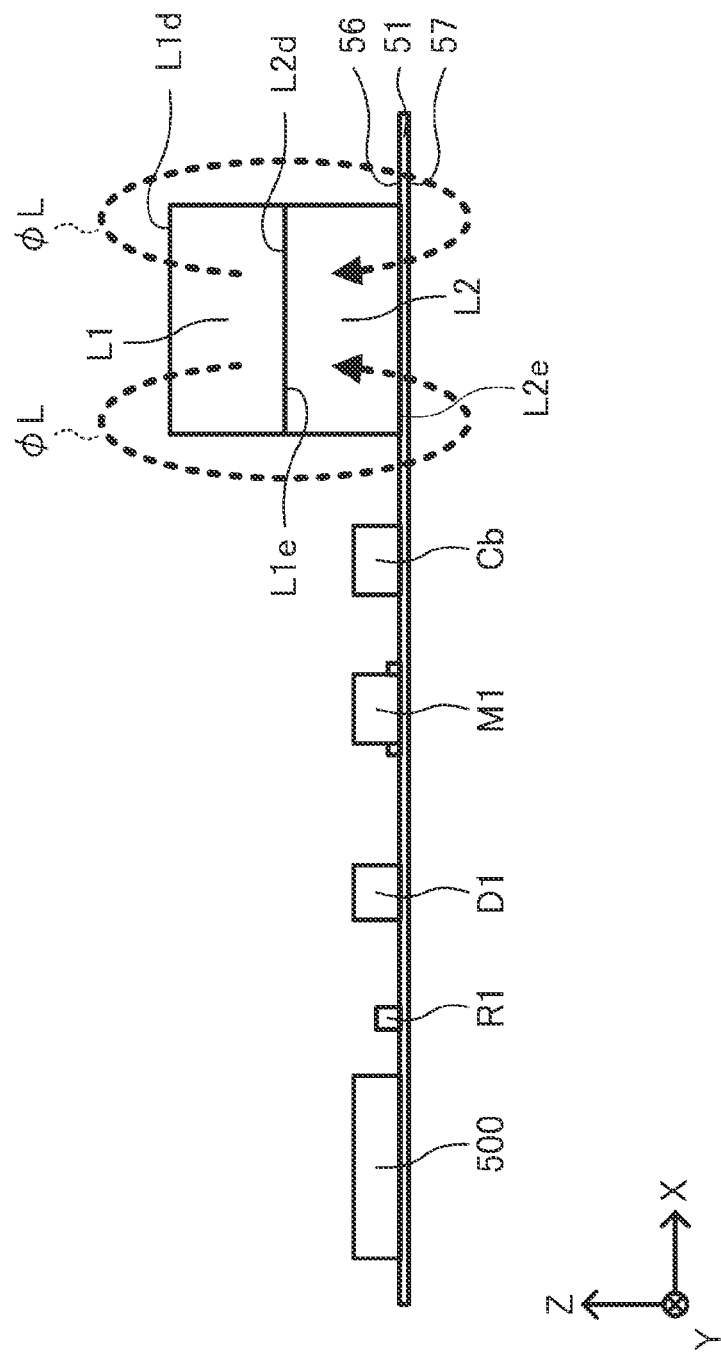
FIG. 18 is a diagram illustrating an example of the direction of a magnetic flux generated by coils L1 and L2 in the drive circuit.

In the drive circuit 50 in the present embodiment, the coils L1 and L2 are provided on the face 56 of the substrate 51 so that the magnetic flux generated in the coil L1 and the magnetic flux generated in the coil L2 are superposed. Here, an example of the arrangement of the coils L1 and L2 on the substrate 51 provided so that the magnetic flux generated in the coil L1 and the magnetic flux generated in the coil L2 are superposed will be described with reference to FIGS. 16 to 18. FIG. 16 is a diagram illustrating an example of how the coils L1 and L2 are overlapped in the Z direction of the face 56 of the substrate 51. FIG. 17 is a diagram illustrating an example of the direction of the magnetic flux generated in each of the coils L1 and L2 when the coils L1 and L2 are provided as shown in FIG. 16. FIG. 18 is a diagram illustrating an example of the direction of the magnetic flux generated by the coils L1 and L2 in the drive circuit 50.

As shown in FIG. 16, the coil L1 and the coil L2 are provided on the substrate 51 so that the electrode L1a of the coil L1 and the electrode L2a of the coil L2 overlap in the Z direction, the electrode L1b of the coil L1 and the electrode L2b of the coil L2 overlap in the Z direction, and the face L1e of the coil L1 and the face L2d of the coil L2 are in contact with each other. The face L2e of the coil L2 is provided on the substrate 51. The electrode L1a of the coil L1 and the electrode L2a of the coil L2 may not overlap in the Z direction, and the electrode L1b of the coil L1 and the electrode L2b of the coil L2 may not overlap in the Z direction.

A counterclockwise annular current IL1 when the coil L1 is viewed from the face L1d as shown in FIG. 17 flows in the coil L1 in a direction along the winding direction of the annular wire L1c. As a result, a magnetic flux φL1 is generated in the coil L1 in the direction from the face L1d to the face L1e. Similarly, a counterclockwise annular current IL2 when the coil L2 is viewed from the face L2d as shown in FIG. 17 flows in the coil L2 in a direction along the winding direction of the annular wire L2c. As a result, a magnetic flux φL2 is generated in the coil L2 in the direction from the face L2d to the face L2e. The coils L1 and L2 are provided on the substrate 51 so that the face L1e of the coil L1 and the face L2d of the coil L2 are in contact with each other, so that the magnetic flux generated between the face L1e of the coil L1 and the face L2d of the coil L2 is canceled, and the magnetic flux φL1 generated in a region surrounded by the annular wire L1c of the coil L1 and the magnetic flux φL2 generated in the region surrounded by the annular wire L2c of the coil L2 are superposed. As a result, as shown in FIG. 18, a magnetic flux φL that is approximately equal to the sum of the magnetic flux φL1 generated in the coil L1 and the magnetic flux φL2 generated in the coil L2 is generated. That is, that the magnetic flux φL1 generated in the coil L1 and the magnetic flux φL2 generated in the coil L2 are superposed includes that the magnetic flux φL1 generated inside the annular wire L1c of the coil L1 is not canceled by the magnetic flux φL2 generated by the coil L2, and the magnetic flux φL2 generated inside the annular wire L2c of the coil L2 is canceled by the magnetic flux φL2 generated by the coil L1.

In addition, in the description of FIGS. 16 to 18, an example in which a region surrounded by the annular wire L1c of the coil L1 and a region surrounded by the annular wire L2c of the coil L2 overlap in the direction normal to the face 56 of the substrate 51 is described. It is sufficient that at least part of the coil L1 and at least part of the coil L2 overlap each other in the direction normal to the face 56 of the substrate 51. The region surrounded by the annular wire L1c of the coil L1, the region surrounded by the annular wire L2c of the coil L2 does not have to overlap in the direction normal to the face 56 of the substrate 51.

That is, the coils L1 and L2 may be positioned so that at least part of the coil L1 and at least part of the coil L2 overlap in the direction normal to the face 56 so that the magnetic flux φL1 generated in the region surrounded by the annular wire L1c of the coil L1 and the magnetic flux φL2 generated in the region surrounded by the annular wire L2c of the coil L2 are superposed.

However, the magnetic flux density of each of the magnetic flux φL1 generated in the coil L1 and the magnetic flux φL2 generated in the coil L2 is highest in the region surrounded by the annular wire L1c of the coil L1 and the region surrounded by the annular wire L2c of the coil L2. For this reason, as shown in FIGS. 16 to 18, it is preferable to position the coils L1 and L2 so that the region surrounded by the annular wire L1c of the coil L1 and the region surrounded by the annular wire L2c of the coil L2 overlap in the direction normal to the face 56 of the substrate 51. As a result, the magnetic flux φL1 generated in the coil L1 and the magnetic flux φL2 generated in the coil L2 are efficiently superimposed, and as a result, the inductance value of the low-pass filter of the smoothing circuit 560 composed of the coils L1 and L2 can be increased. As a result, it is possible to reduce the capacity of the capacitor C1 included in the low-pass filter of the smoothing circuit 560, and the possibility that a waveform distortion due to the capacitance component of the capacitor C1 may occur in the signal waveform of the drive signal COMA demodulated in the smoothing circuit 560 is reduced, so that it is possible to further improve the waveform accuracy of the drive signal COMA.

Further, since the coils L1 and L2 are both provided on the face 56 of the substrate 51, there is no need to provide a via or the like between the coils L1 and L2 electrically coupled in parallel, and as a result, it is possible to improve the accuracy of the amplified modulation signal AMs input to the coils L1 and L2. Therefore, it is possible to improve the waveform accuracy of the drive signal COMA output from the smoothing circuit 560 including the coils L1 and L2.

Here, the magnetic flux φL1 is an example of a first magnetic flux, and the magnetic flux φL2 is an example of a second magnetic flux.

1.7 Functions and Effects

As described above, in the liquid ejecting apparatus 1 and the drive circuits 50-a and 50-b according to the embodiment, the smoothing circuit 560 includes the coils L1 and L2 electrically coupled in parallel. As a result, the currents generated by the drive signals COMA and COMB output from the drive circuits 50-a and 50-b and the feedback signals of the drive circuits 50-a and 50-b flow dispersely in the coils L1 and L2, respectively. That is, even when the currents generated by the drive signals COMA and COMB output from the drive circuits 50-a and 50-b, respectively, and the feedback signals of the drive circuits 50-a, 50-b are large, it is possible to reduce the amount of current flowing through each of the coils L1 and L2. Therefore, it is possible to output a sufficient amount of current from the drive circuits 50-a and 50-b, and it is possible to reduce power consumption in the coils L1 and L2.

In this case, in the liquid ejecting apparatus 1 and the drive circuits 50-a and 50-b according to the present embodiment, the coils L1 and L2 are positioned so as to at least partially overlap each other in the direction normal to the substrate 51. This makes it possible to shorten the wire of the path through which the amplified modulation signal AMs input to the coil L1 propagates and the wire of the path through which the amplified modulation signal AMs input to the coil L2 propagates. As a result, it is possible to reduce the influence of an parasitic impedance due to the wire of the path through which the amplified modulation signal AMs input to the coil L1 propagates and the wire of the path through which the amplified modulation signal AMs input to the coil L2 propagates, so that the waveform accuracy of the drive signals COMA and COMB output from the drive circuits 50-a and 50-b, respectively, is improved. Therefore, it is possible to reduce the possibility that the ejection accuracy of the ink ejected from the liquid ejecting apparatus 1 deteriorates.

Furthermore, in the liquid ejecting apparatus 1 and the drive circuits 50-a and 50-b in the embodiment, the coils L1 and L2 are positioned so that the magnetic flux φL1 generated by the current IL1 flowing through the coil L1 and the magnetic flux φL2 generated by the current IL2 flowing through the coil L2 are superposed. Therefore, it is possible to obtain any inductance value by appropriately combining the magnetic materials of the coils L1 and L2 provided in parallel, the number of turns, and the like. That is, it is possible to improve the accuracy of the cutoff characteristics of the low-pass filter included in the smoothing circuit 560. Therefore, it is possible to further improve the waveform accuracy of the drive signals COMA and COMB demodulated by the smoothing circuit 560.

2. Second Embodiment

In the liquid ejecting apparatus 1 and the drive circuits 50-a and 50-b in the second embodiment, the arrangement of the coils L1 and L2 mounted on the substrate 51 is different from that in the liquid ejecting apparatus 1 in the first embodiment. In the description of the liquid ejecting apparatus 1 and the drive circuits 50-a and 50-b according to the second embodiment, the same components as those of the liquid ejecting apparatus 1 and the drive circuits 50-a and 50-b according to the first embodiment are denoted by the same reference numerals, and the detailed description thereof will be omitted or simplified.

FIG. 19 shows an example of the arrangement of the coils L1 and L2 mounted on the substrate 51 and the direction of the magnetic flux generated by the coils L1 and L2 in the liquid ejecting apparatus 1 and the drive circuits 50-a and 50-b of the second embodiment.

In the liquid ejecting apparatus 1 and the drive circuits 50-a and 50-b in the second embodiment, the coil L1 is mounted on the face 56 of the substrate 51 and the coil L2 is mounted on the face 57 of the substrate 51. Specifically, the smoothing circuit 560 includes the coil L1 and the coil L2 electrically coupled to the coil L1 in parallel, the coil L1 is provided on the face 56 of the substrate 51, the coil L2 is provided on the face 57 of the substrate 51, and the coil L1 is positioned so as to overlap at least part of the coil L2 in the direction normal to the face 56 of the substrate 51.

Specifically, when the coils L1 and L2 have the structure shown in FIGS. 14 and 15, the coil L1 is mounted such that the face L1e contacts the face 56 of the substrate 51, and the coil L2 is mounted such that the face Ltd contacts the face 57 of the substrate 51. Even the liquid ejecting apparatus 1 and the drive circuits 50-a and 50-b of the second embodiment configured as described above has the same functions and effects as the liquid ejecting apparatus 1 and the drive circuits 50-a and 50-b of the first embodiment.

In addition, a space for ensuring a insulation performance is formed between the circuit substrate and the surrounding structure. In the liquid ejecting apparatus 1 and the drive circuits 50-a and 50-b of the second embodiment, the coil L1 is positioned on the face 56 of the substrate 51, and the coil L2 is positioned on the face 57 of the substrate 51, so that it is possible to reduce the space for securing the insulation performance generated around the substrate 51. In other words, it is possible to reduce the dead space around the substrate 51. Therefore, the liquid ejecting apparatus 1 and the drive circuits 50-a and 50-b of the second embodiment can be downsized, compared with the liquid ejecting apparatus 1 and the drive circuits 50-a and 50-b of the first embodiment.

Although the embodiments have been described above, the present disclosure is not limited to the embodiments, and can be implemented in various modes without departing from the gist of the disclosure. For example, the above embodiments can be appropriately combined.

The disclosure includes a configuration substantially same as the configuration described in the embodiments (for example, a configuration having the same function, method, and result, or a configuration having the same object and effect). Further, the disclosure includes a configuration in which a non-essential part of the configuration described in the embodiments is replaced. Further, the disclosure includes a configuration having the same functions and effects as the configuration described in the embodiments or a configuration capable of achieving the same object. The disclosure also includes a configuration in which a known technique is added to the configuration described in the embodiments.

The following contents are derived from the above-described embodiments and modifications.

An aspect of the liquid ejecting apparatus includes a liquid ejection head including a drive element, where the liquid ejection head ejects a liquid by a supply of a drive signal to the drive element, and a drive circuit that outputs the drive signal, wherein the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a first face and a second face opposite to the first face, wherein the demodulation circuit includes a first coil and a second coil electrically coupled in parallel with the first coil, and wherein the first coil is positioned so as to overlap at least part of the second coil in a direction normal to the first face.

According to the liquid ejecting apparatus, the demodulation circuit includes the first coil and the second coil electrically coupled to the first coil in parallel, so that it is possible to reduce an increase in power consumption in each of the first coil and the second coil even when the amount of current flowing through the demodulation circuit increases. Therefore, it is possible to output a sufficient amount of current from the drive circuit and reduce the power consumption of the inductance element included in the demodulation circuit.

In an aspect of the liquid ejecting apparatus, the first coil and the second coil may be provided on the first face of the substrate.

According to the liquid ejecting apparatus, it is not necessary to provide a via or the like between the first coil and the second coil which are electrically coupled in parallel. Therefore, it is possible to improve the waveform accuracy of the drive signal output from the demodulation circuit.

In an aspect of the liquid ejecting apparatus, the first coil may be provided on the first face, and the second coil may be provided on the second face.

According to the liquid ejecting apparatus, since the first coil and the second coil are provided on different faces of the substrate, it is possible to reduce the dead space generated around the substrate. Therefore, it is possible to downsize the drive circuit including the first coil and the second coil, and the liquid ejecting apparatus including the drive circuit.

In an aspect of the liquid ejecting apparatus, the first coil and the second coil may be positioned so that a first magnetic flux generated in the first coil and a second magnetic flux generated in the second coil are superposed.

According to the liquid ejecting apparatus, the first magnetic flux generated in the first coil and the second magnetic flux generated in the second coil are cancelled, so that it is possible to reduce the possibility that the characteristics of the demodulation circuit including the first coil and the second coil, which are electrically coupled in parallel, deteriorate.

In an aspect of a drive circuit that outputs a drive signal for driving a drive element, the drive circuit includes a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, wherein the substrate includes a first face and a second face opposite to the first face, wherein the demodulation circuit includes a first coil and a second coil electrically coupled in parallel with the first coil, and wherein the first coil is positioned so as to overlap at least part of the second coil in a direction normal to the first face.

According to the drive circuit, the demodulation circuit includes the first coil and the second coil electrically coupled to the first coil in parallel, so that it is possible to reduce an increase in power consumption in each of the first coil and the second coil even when the amount of current flowing through the demodulation circuit increases. Therefore, it is possible to output a sufficient amount of current from the drive circuit and reduce the power consumption of the inductance element included in the demodulation circuit.

What is claimed is:
1. A liquid ejecting apparatus comprising:
a liquid ejection head including a drive element, the liquid ejection head ejecting a liquid by a supply of a drive signal to the drive element; and
a drive circuit that outputs the drive signal, wherein
the drive circuit includes
a modulation circuit that modulates a base drive signal to output a modulation signal, an amplifier circuit that amplifies the modulation signal to output an amplified modulation signal, a demodulation circuit that demodulates the amplified modulation signal to output the drive signal, and a substrate on which the modulation circuit, the amplifier circuit, and the demodulation circuit are provided, the substrate includes a first face and a second face opposite to the first face, the demodulation circuit includes a first coil and a second coil electrically coupled in parallel with the first coil, the first coil is positioned so as to overlap at least part of the second coil in a direction normal to the first face, and the first coil is provided on the first face, and the second coil is provided on the second face.

2. The liquid ejecting apparatus according to claim 1, wherein the first coil and the second coil are positioned so that a first magnetic flux generated in the first coil and a second magnetic flux generated in the second coil are superposed.

3. A drive circuit that outputs a drive signal for driving a drive element, the drive circuit comprising:

a modulation circuit that modulates a base drive signal to output a modulation signal;

an amplifier circuit that amplifies the modulation signal to output an amplified modulation signal;

a demodulation circuit that demodulates the amplified modulation signal to output the drive signal; and a substrate on which the modulation circuit, the amplifier circuit, and the demodulation circuit are provided, wherein the substrate includes a first face and a second face opposite to the first face, the demodulation circuit includes a first coil and a second coil electrically coupled in parallel with the first coil, the first coil is positioned so as to overlap at least part of the second coil in a direction normal to the first face, and the first coil is provided on the first face, and the second coil is provided on the second face.

* * * * *